(12) United States Patent
Kudela et al.

(10) Patent No.: US 11,823,871 B2
(45) Date of Patent: Nov. 21, 2023

(54) MICROWAVE PLASMA SOURCE FOR SPATIAL PLASMA ENHANCED ATOMIC LAYER DEPOSITION (PE-ALD) PROCESSING TOOL

(71) Applicant: Applied Materials, Inc., Santa Clara, CA (US)

(72) Inventors: Jozef Kudela, Morgan Hill, CA (US); Tsutomu Tanaka, Santa Clara, CA (US); Alexander V. Garachtchenko, Mountain View, CA (US); Dmitry A. Dzilno, Sunnyvale, CA (US); Avinash Shervegar, San Jose, CA (US); Kallol Bera, Fremont, CA (US); Xiaopu Li, San Jose, CA (US); Anantha K. Subramani, San Jose, CA (US); John C. Forster, Mt. View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 722 days.

(21) Appl. No.: 16/976,569

(22) PCT Filed: Mar. 1, 2019

(86) PCT No.: PCT/US2019/020264
§ 371 (c)(1),
(2) Date: Aug. 28, 2020

(87) PCT Pub. No.: WO2019/169253
PCT Pub. Date: Sep. 6, 2019

(65) Prior Publication Data
US 2021/0050187 A1 Feb. 18, 2021

Related U.S. Application Data

(60) Provisional application No. 62/637,353, filed on Mar. 1, 2018.

(51) Int. Cl.
*C23C 16/509* (2006.01)
*H01J 37/32* (2006.01)
*C23C 16/455* (2006.01)

(52) U.S. Cl.
CPC .. *H01J 37/32211* (2013.01); *C23C 16/45536* (2013.01); *H01J 37/3244* (2013.01);
(Continued)

(58) Field of Classification Search
CPC .......... H01J 37/32211; H01J 37/32348; H01J 37/3244; H01J 37/32541; H01J 2237/332;
(Continued)

(56) References Cited

U.S. PATENT DOCUMENTS 8,883,269 B2  11/2014  Won et al.
9,922,854 B2  3/2018  Kurita et al.
(Continued)

FOREIGN PATENT DOCUMENTS

DE  19503205 C1  7/1996
JP  H11260593 A  9/1999
(Continued)

OTHER PUBLICATIONS

PCT International Search Report and Written Opinion in PCT/US2019/020264 dated Jun. 12, 2019, 12 pages.
(Continued)

*Primary Examiner* — Minh D A
(74) *Attorney, Agent, or Firm* — Servilla Whitney LLC

(57) ABSTRACT

Plasma source assemblies, gas distribution assemblies including the plasma source assembly and methods of generating plasma are described. The plasma source assemblies include a powered electrode with a ground electrode adjacent a first side and a dielectric adjacent a second side. A first microwave generator is electrically coupled to the first end of the powered electrode through a first feed and a
(Continued)

second microwave generator is electrically coupled to the second end of the powered electrode through a second feed.

20 Claims, 21 Drawing Sheets

(52) U.S. Cl.
CPC .. *H01J 37/32348* (2013.01); *H01J 37/32541* (2013.01); *H01J 2237/332* (2013.01)
(58) Field of Classification Search
CPC ........... H01J 37/32192; H01J 37/32256; H01J 37/32229; C23C 16/45536
See application file for complete search history.

(56) References Cited

U.S. PATENT DOCUMENTS

| | | | |
|---|---|---|---|
| 2004/0056602 | A1 | 3/2004 | Yang et al. |
| 2008/0277064 | A1* | 11/2008 | Kim .................. H01J 37/32091 156/345.38 |
| 2009/0238998 | A1 | 9/2009 | Stowell et al. |
| 2011/0097518 | A1 | 4/2011 | Olgado |
| 2011/0192349 | A1 | 8/2011 | Hammond, IV et al. |
| 2012/0090782 | A1 | 4/2012 | Ikeda et al. |
| 2014/0103808 | A1 | 4/2014 | Heil et al. |
| 2015/0262794 | A1* | 9/2015 | Kihara .............. H01J 37/32568 216/71 |
| 2015/0380221 | A1* | 12/2015 | Liu .................. C23C 16/45536 313/231.41 |
| 2016/0024653 | A1 | 1/2016 | Forster et al. |
| 2019/0057840 | A1 | 2/2019 | Collins et al. |
| 2019/0311886 | A1 | 10/2019 | Chandrasekar et al. |
| 2021/0050187 | A1 | 2/2021 | Kudela et al. |

FOREIGN PATENT DOCUMENTS

| | | |
|---|---|---|
| JP | 2007157535 A | 6/2007 |
| KR | 101180373 B1 | 9/2012 |
| KR | 20160049628 A | 5/2016 |
| KR | 20160132996 A | 11/2016 |
| TW | 201528365 A | 7/2015 |
| TW | 201833973 A | 9/2018 |
| WO | 2011006018 A2 | 1/2011 |

OTHER PUBLICATIONS

Ji, T-R , et al., "A Versatile Microwave Plasma Applicator", International Microwave Power Institute ((1988), 8 pages.
Kanoh, Masaaki , et al., "Inductively Coupled Plasma Source with Internal Straight Antenna", Jpn. J. Appl. Phys., vol. 40 (2001), pp. 5419-5423, Part 1, No. 9A, Sep. 2001.
Kim, Kyong Nam, et al., "Characteristics of Parallel Internal-Type Inductively Coupled Plasmas for Large Area Flat Panel Display Processing", Japanese Journal of Applied Physics, vol. 43, No. 7A, (2004), pp. 4373-4375.
Moisan, M. , et al., "The Development and Use of Surface-Wave Sustained Discharges for Applications", Text prepared for the NATO Summer School (Sozopol, May 98), to be published in 1999 in Advanced Technologies Based on Wave and Beam Generated Plasmas, 40 pages.
Rauchle, E. , "Duo-plasmaline, a surface wave sustained linearly extended discharge", J. Phys. IV France 8 (1998), 10 pages.
Sauve, G. , et al., "Slotted Waveguide Field Applicator for the Generation of Long Uniform Plasmas", International Microwave Power Institute (1993), 9 pages.
Sugai, H. , et al., "High-density flat plasma production based on surface waves", Plasma Sources Sci. Technol. 7 (1998), pp. 192-205.
Takeuchi, Yoshiaki , et al., "Characteristics of Very High-Frequency-Excited SiH4 Plasmas using a Ladder-Shaped Electrode", Jpn. J. Appl. Phys., vol. 40 (2001), pp. 3405-3408, Part 1, No. 5A, May 2001.
Walker, M. , et al., "Silicon oxide films from the Plasmodul", Vacuum 57 (2000), pp. 387-397.
Yamamoto, Tetsuya , et al., "Design of Radial Line Slot Antennas at 8.3 GHz for Large Area Uniform Plasma Generation", Jpn. J. Appl. Phys., vol. 38 (1999), pp. 2082-2088, Part 1, No. 4A, Apr. 1999.
Yasaka, Yasuyoshi , et al., "Production of Large-Diamete Uniform Plasma in mTorr Range Using Microwave Discharge", Jpn. J. Appl. Phys., vol. 38 (1999), pp. 4309-4312.
PCT International Search Report and Written Opinion in PCT/US2022/026918 dated Aug. 18, 2022, 12 pages.

* cited by examiner

MICROWAVE PLASMA SOURCE FOR SPATIAL PLASMA ENHANCED ATOMIC LAYER DEPOSITION (PE-ALD) PROCESSING TOOL

CROSS-REFERENCE TO RELATED APPLICATIONS

This application is the National Stage entry of PCT/US2019/020264, filed on Mar. 1, 2019, which claims priority to United States Provisional Application Ser. No. 62/637,353, filed Mar. 1, 2018, the entire disclosures of which are hereby incorporated by reference herein.

FIELD

Embodiments of the disclosure generally relate to apparatus for plasma enhanced substrate processing. More particularly, embodiments of the disclosure relate to modular microwave plasma sources for use with processing chambers like spatial atomic layer deposition batch processors.

BACKGROUND

Atomic Layer Deposition (ALD) and Plasma-Enhanced ALD (PEALD) are deposition techniques that offer control of film thickness and conformality in high-aspect ratio structures. Due to continuously decreasing device dimensions in the semiconductor industry, there is increasing interest and applications that use ALD/PEALD. In some cases, only PEALD can meet specifications for desired film thickness and conformality.

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Typically, PEALD tools use capacitive plasma sources in RF/VHF frequency band up to several tens of MHz. These plasmas have moderate densities and can have relatively high ion energies. Using microwave fields at frequencies in GHz range instead, in certain resonant or wave-propagation electromagnetic modes, plasma of very high charge and radical densities and with very low ion energies can be generated. The plasma densities can be in the range of $10^{12}$/cm$^3$ or above and ion energies can be as low as ~5-10 eV. Such plasma features are becoming increasingly important in damage-free processing of modern silicon devices.

One challenge for microwave plasmas is discharge-stability and uniformity control. In microwave band, wavelengths of electromagnetic (EM) fields are typically smaller than substrates being processed and wave-plasma interaction can be very strong. Therefore, microwave plasmas tend to be unstable and spatially very non-uniform, and can even be localized just at power input(s) and not easily spread over larger processing wafer/substrates.

Therefore, there is a need in the art for improved apparatus and methods of forming microwave plasmas.

SUMMARY

One or more embodiments of the disclosure are directed to plasma source assemblies comprising a powered electrode having a first end and a second end defining a length and having an axis extending along the length of the powered electrode. The powered electrode has a width. A ground electrode is on the first side of the powered electrode. The ground electrode is spaced from the powered electrode by a distance. A dielectric is on a second side of the powered electrode. The dielectric and ground electrode enclose the powered electrode. The dielectric has an inner face adjacent the powered electrode and an outer face opposite the inner face. A first microwave generator is electrically coupled to the first end of the powered electrode through a first feed. A second microwave generator is electrically connected to the second end of the powered electrode through a second feed.

Additional embodiments of the disclosure are directed to plasma source assemblies comprising a flat powered electrode having a first end and a second end and having an axis extending along an elongate axis of the plasma source assembly. The powered electrode has a width. A ground electrode is on a first side of the powered electrode. The ground electrode is spaced from the powered electrode by a second dielectric and includes a gas inlet. A dielectric is on a second side of the powered electrode. The dielectric and a second dielectric enclose the powered electrode to prevent electrical contact between the powered electrode and the ground electrode. The dielectric has a gas channel extending along the elongate axis of the plasma source assembly. The gas inlet is in fluid communication with one or more plenum extending along elongate axis. The one or more plenum is in fluid communication with the gas channel through one or more gas conduits. A first microwave generator is electrically coupled to the first end of the powered electrode through a first feed. The first microwave generator operates at a first frequency. A second microwave generator is electrically coupled to the second end of the powered electrode through a second feed. The second microwave generator operates at a second frequency. The first frequency and the second frequency are within the range of about 900 MHz to about 930 MHz or in the range of about 2.4 to about 2.5 GHz and the first frequency and the second frequency are different.

Further embodiments of the disclosure are directed to methods of providing a plasma. A first microwave power is provided from a first microwave generator to a first end of a powered electrode. A second microwave power is provided from a second microwave generator to a second end of the powered electrode. The first microwave power and second microwave power operating at frequencies in the range of about 900 MHz to about 930 MHz or in the range of about 2.4 to about 2.5 GHz. The powered electrode is enclosed in a dielectric with a ground electrode on a first side of the powered electrode. A plasma is formed adjacent the dielectric on a second side of the powered electrode different from the first side.

Additional embodiments of the disclosure are directed to plasma source assemblies comprising a powered electrode having a first end and a second end defining a length. The powered electrode has an axis extending along the length of the powered electrode. The powered electrode has a width.

A ground electrode is on a first side of the powered electrode. The ground electrode is spaced from the powered electrode by a distance. A dielectric is on a second side of the powered electrode. The dielectric and ground electrode enclose the powered electrode. The dielectric has an inner face adjacent the powered electrode and an outer face opposite the inner face. A first feed is electrically coupled to the powered electrode and a second feed is electrically coupled to the powered electrode. The first feed is electrically coupled with a first microwave generator and the second feed is electrically coupled to a dummy load.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide a substrate processing system for continuous substrate deposition to maximize throughput and improve processing efficiency. One or more embodiments of the disclosure are described with respect to a spatial atomic layer deposition chamber; however, the skilled artisan will recognize that this is merely one possible configuration and other processing chambers and plasma source modules can be used.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front face of the gas distribution assembly is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Figure 1:
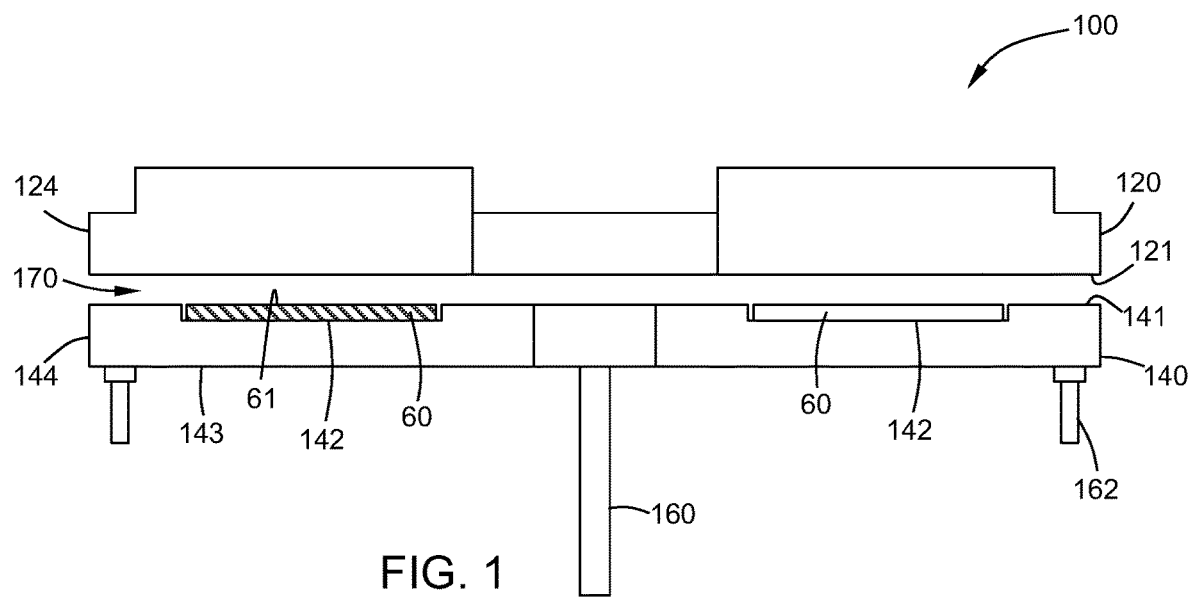
FIG. 1 shows a schematic cross-sectional view of a substrate processing system in accordance with one or more embodiments of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels.

As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
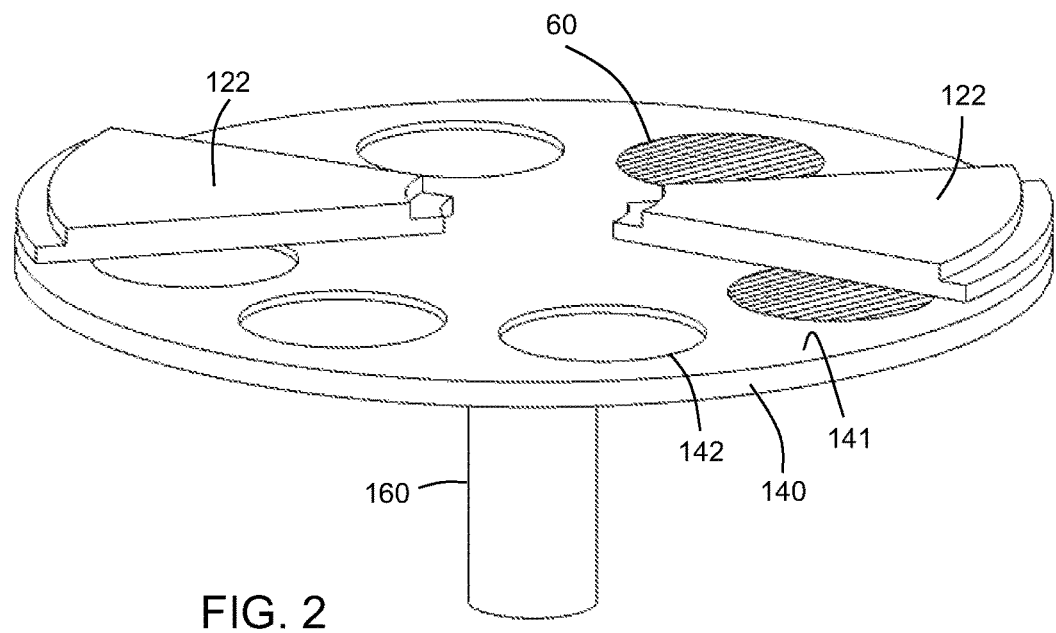
FIG. 2 shows a perspective view of a substrate processing system in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the water is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
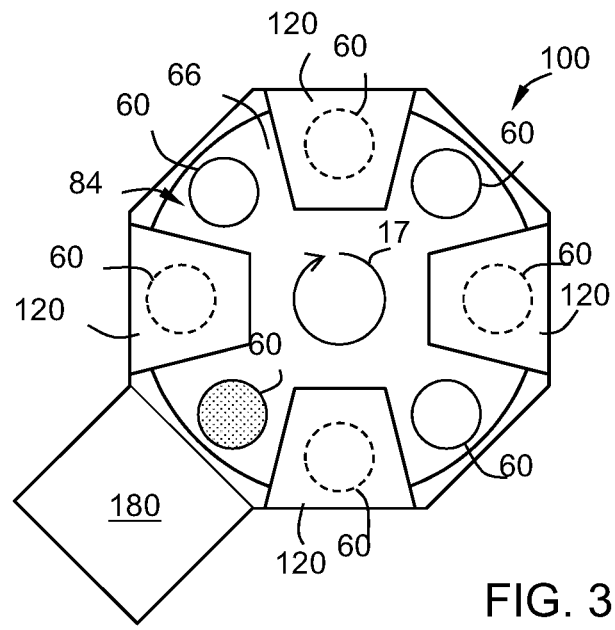
FIG. 3 shows a schematic of a substrate processing system in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to a gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120.

In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
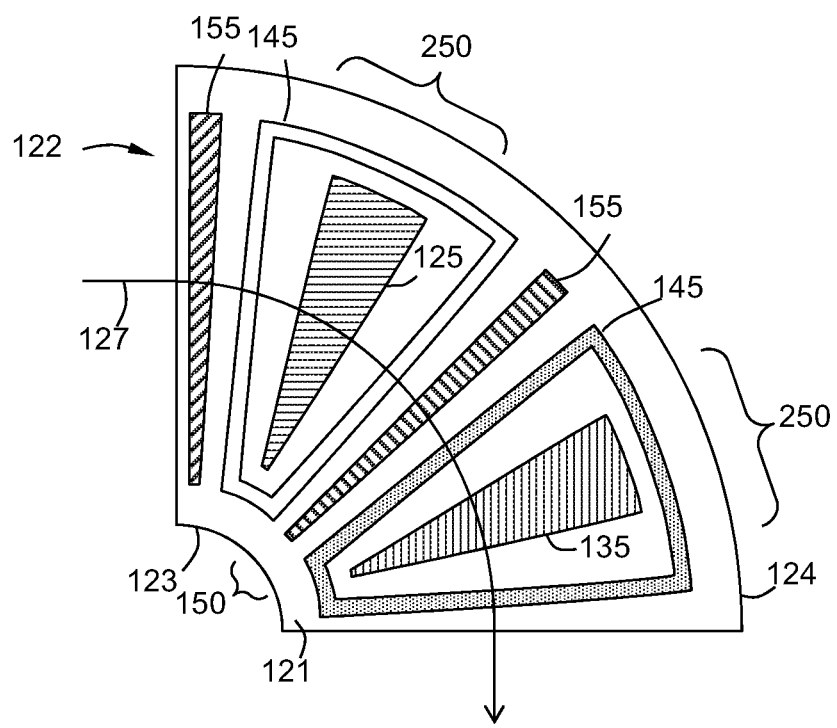
FIG. 4 shows a schematic view of a front of a gas distribution assembly in accordance with one or more embodiment of the disclosure.
Figure 5:
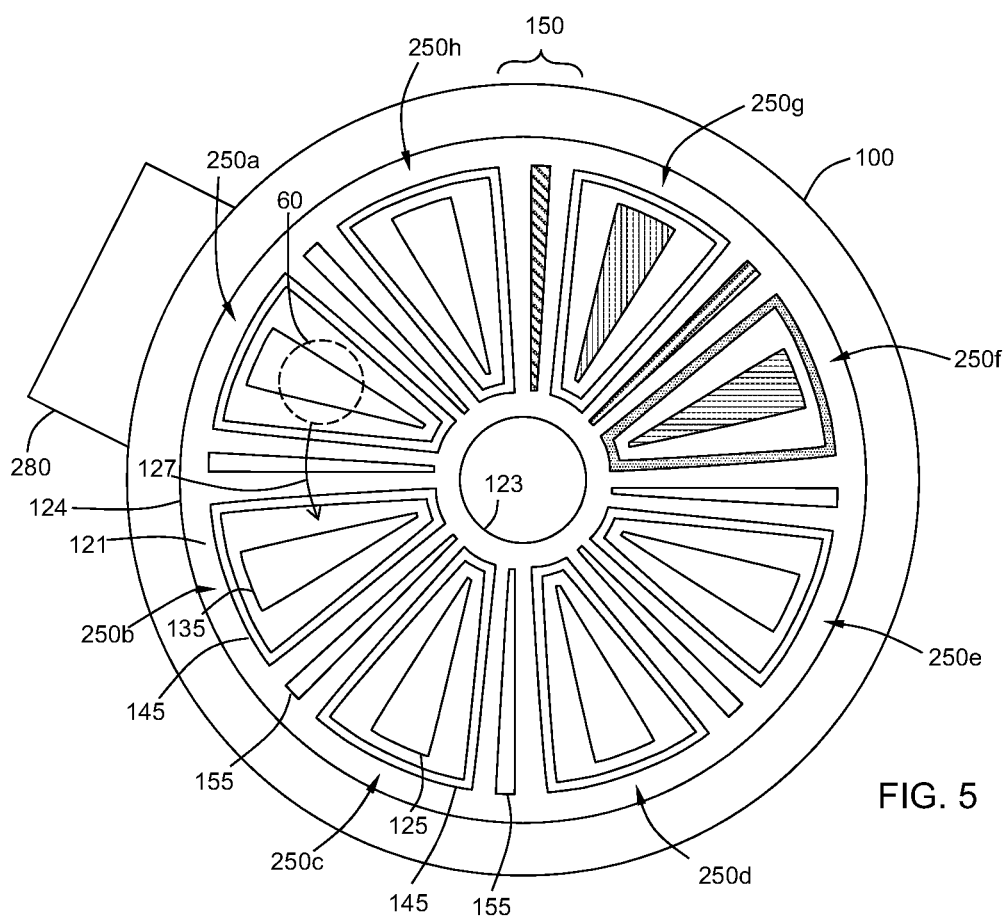
FIG. 5 shows a schematic view of a processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Some embodiments of the disclosure are directed to microwave plasma sources. While the microwave plasma sources are described with respect to a spatial ALD processing chamber, those skilled in the art will understand that the modules are not limited to spatial ALD chambers and can be applicable to any injector situation where microwave plasma can be used.

Some embodiments of the disclosure advantageously provide modular plasma source assemblies, i.e., a source that can be easily inserted into and removed from the processing system. For example, a multi-part gas distribution assembly, like that illustrated in FIG. 5, can be modified to remove one wedge-shaped gas port and replace the gas port with a modular plasma source assembly.

Some embodiments of the disclosure advantageously provide a traveling-wave type plasma applicator that uses plasma not just as "power absorbing medium", but also as a part of "waveguiding medium". Some embodiments of the disclosure advantageously provide a plasma powered electrode that allows for spatially extended microwave plasmas. The plasma powered electrode concept is also referred to as "surface-wave plasma technology". Some embodiments of the disclosure minimize or eliminate reflected power within the plasma applicator (or strip-line powered electrode) to minimize or eliminate a standing wave causing non-uniformity.

Figure 6A:
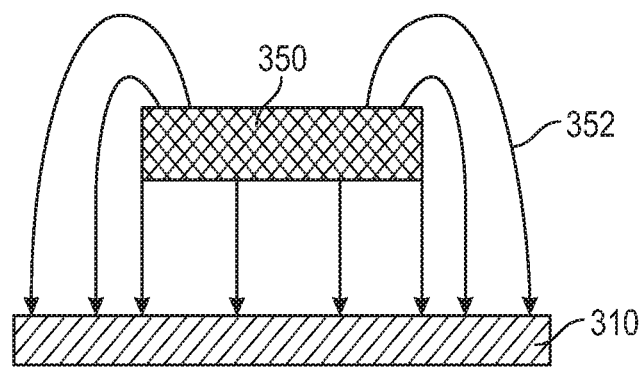
FIGS. 6A through 6C show schematic representations of the electronic coupling in strip-line powered electrode plasma sources.
Figure 6B:
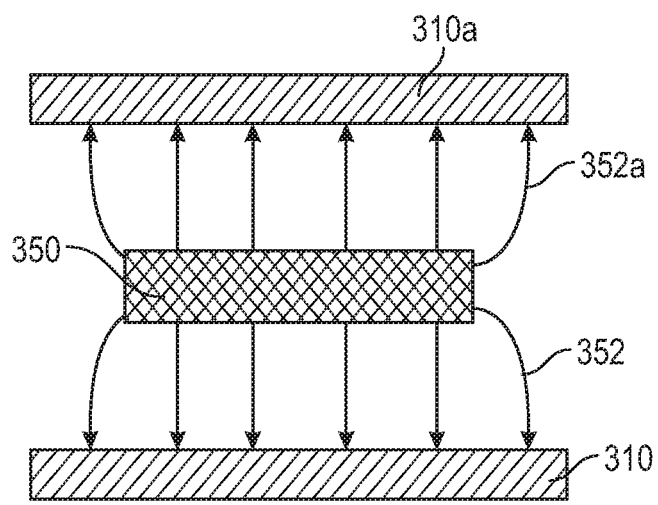
Figure 6C:
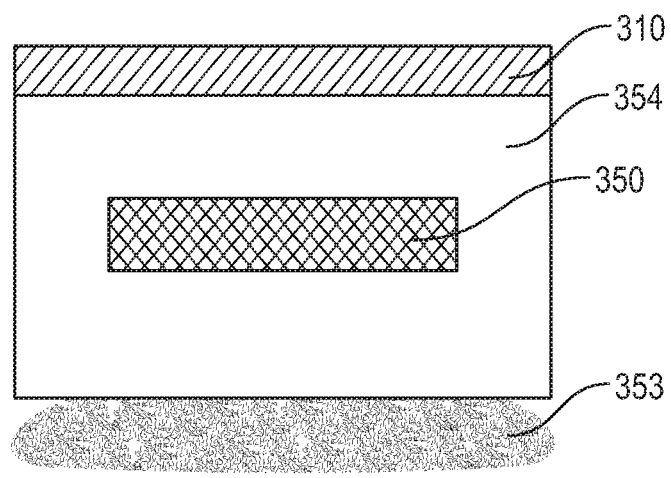

Some embodiments of the disclosure incorporate a "strip-line powered electrode" where plasma acts as one of the two "ground electrodes" of the strip-line powered electrode. For example, FIG. 6A illustrates a strip-line powered electrode 350 spaced from a ground electrode 310. Electric field lines 352 are shown to illustrate the electronic coupling between the powered electrode 350 and the ground electrode 310 when a single ground electrode is present. FIG. 6B illustrates the strip-line powered electrode 350 between and spaced from the ground electrode 310 and ground electrode 310a. Electric field lines 352 illustrate the electronic coupling between the powered electrode 350 and the ground electrode 310 and electric field lines 352a illustrate the electronic coupling between the powered electrode 350 and the ground electrode 310a. FIG. 6C illustrates a powered electrode 350 spaced from a ground electrode 310 with a plasma 353 opposite. The plasma 353 can act as a replacement for the ground electrode 310. The dimensions of the powered electrode 350, spacing between the powered electrode 350 and the ground electrode 310, spacing between the powered electrode 350 and the plasma 353, and the dielectric material 354 composition and dimensions can affect the transmission-line propagation constant. In some embodiments, the width of the electrode is smaller than the length of the electrode. The field lines illustrated are for descriptive purposes and may not be representative of any particular electric fields in use and should not be taken as limiting the scope of the disclosure.

Figure 6D:
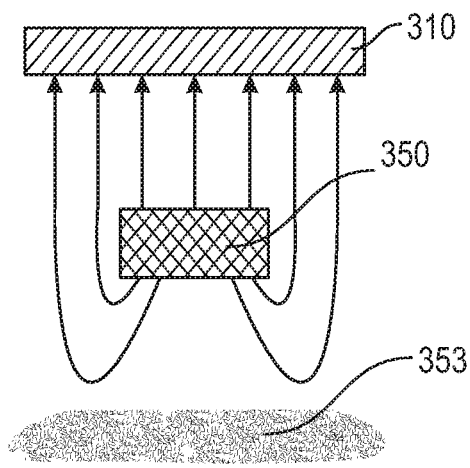
FIGS. 6D and 6E show schematic representations of the electronic coupling in coupling in strip-line powered electrode plasma sources as a function of separation between the powered electrode and ground electrode.
Figure 6E:
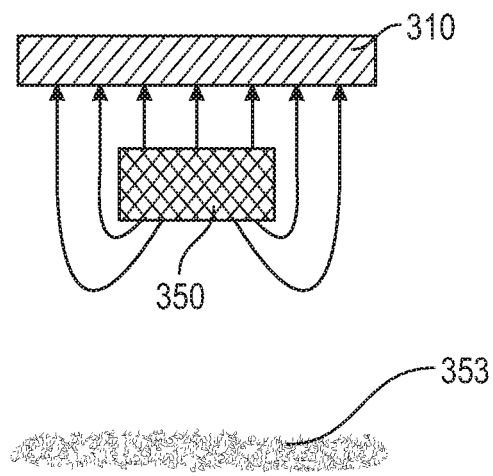

Wave propagation (and attenuation) along the powered electrode are a function of the strip-line geometry and plasma. FIGS. 6D and 6E illustrate the effect of distance between the powered electrode 350 and the ground electrode 310. In FIG. 6D the powered electrode (powered electrode 350) is relatively close to the plasma 353, compared to that of FIG. 6E. The power coupling to the plasma (power loss) is stronger in FIG. 6D (i.e., the wave decays faster and does not propagate as far axially) than in FIG. 6E. If the strip is closer to the metal ground (for a not lossy electrode), voltages on the strip-line are lower and the coupling to the plasma is weaker, i.e., axial power loss (wave attenuation) is weaker and the wave propagates further.

Figure 6F:
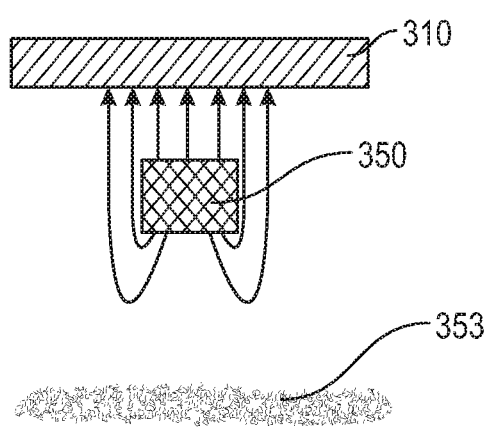
FIGS. 6F and 6G show schematic representations of the electronic coupling in strip-line powered electrode plasma sources as a function of powered electrode cross-sectional width.
Figure 6G:
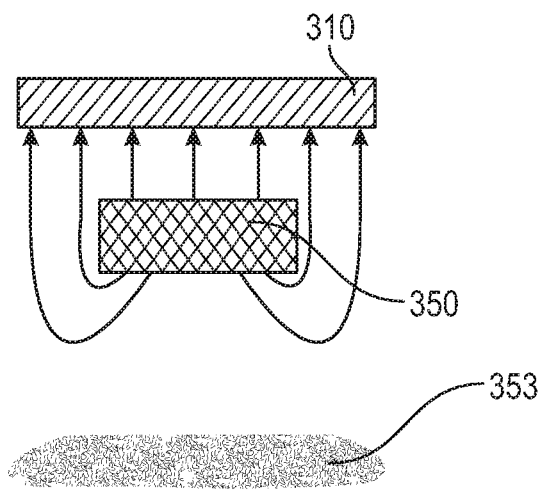

Additionally, the width of the strip (powered electrode 350) can affect wave-propagation (attenuation) constant, i.e., can affect the axial plasma profile. FIG. 6F illustrates a powered electrode 350 with a width that is less than the powered electrode 350 of FIG. 6G. With other considerations being equal, the plasma 353 of FIG. 6F will be confined to a smaller width than the plasma of FIG. 6G.

Referring to FIGS. 7 through 29, one or more embodiments of the disclosure are directed to modular microwave plasma sources 300. As used in this specification and the appended claims, the term "modular" means that plasma source 300 can be attached to or removed from a processing chamber. A modular source can generally be moved, removed or attached by a single person.

Figure 7:
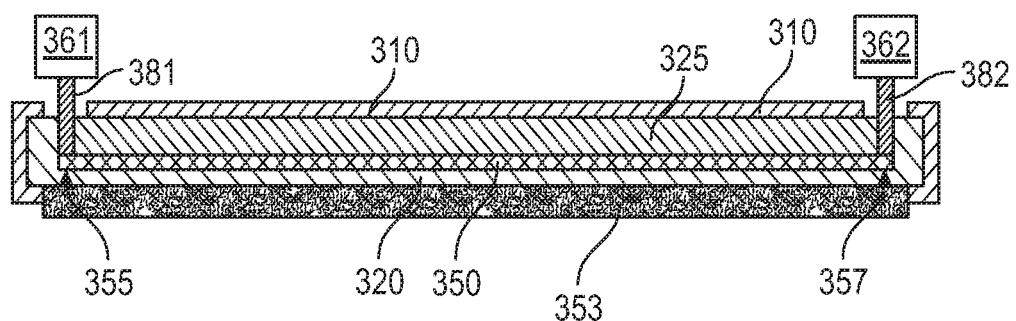
FIG. 7 shows a cross-sectional schematic view of a plasma source assembly in accordance with one or more embodiments of the disclosure.

The plasma applicator (also referred to as strip-line powered electrode 350, strip-line electrode or hot electrode) of some embodiments is a linear plasma source powered by two microwave (MW) generators; one MW generator electrically coupled to each end of the plasma applicator, as illustrated in FIG. 7. The first MW generator 361 and second MW generator 362 can be tuned to slightly different frequencies to minimize standing-wave issues. Without being bound by any particular theory of operation, it is believed that using two generators also enables power balance between two plasma-applicator ends and control of end-to-end plasma skew. The strip-line powered electrode 350 can have varying geometry (e.g., strip-electrode width/shape and/or distance to plasma 353/ground electrode 310 to control the plasma profile. The strip-line powered electrode 350 illustrated in FIG. 7 is separated from the ground electrode 310 and the plasma by a dielectric 320.

Figure 8:
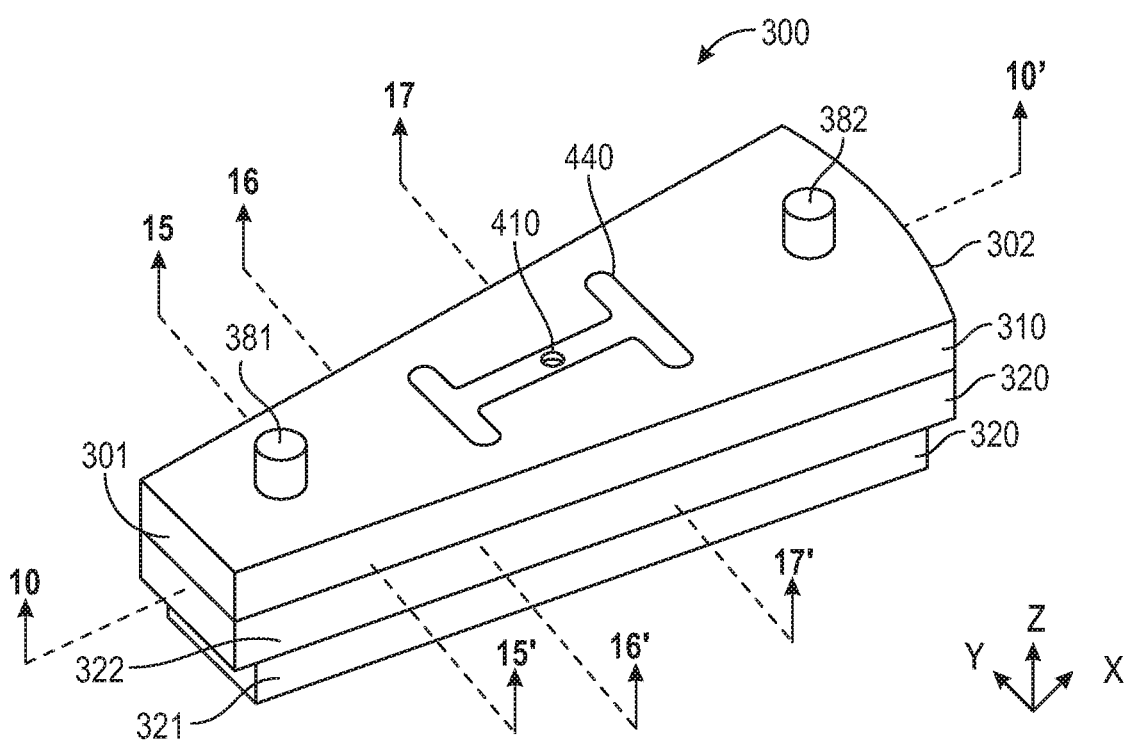
FIG. 8 shows an isometric view of a plasma source assembly in accordance with one or more embodiments of the disclosure.

Referring to FIG. 8, one or more embodiments of the disclosure are directed to plasma source assemblies 300 including a ground electrode 310 and a dielectric 320. The plasma source assembly 300 illustrated is a wedge-shaped component that may be usable with a gas distribution assembly, like that of FIG. 5. The plasma source assembly 300 illustrated has an inner peripheral edge 301 and an outer peripheral edge 302 which form the bounds of an elongate axis.

The ground electrode 310 and dielectric 320 can be enclosed within a housing (not shown) or can form the outer surface of the assembly 300. In the embodiment shown in FIG. 8, the dielectric 320 has a lower portion 321 inset from the upper portion 322 to form a tiered outer surface. The tiered outer surface can provide a support surface (on the exposed bottom of the upper portion 322) that can support the assembly 300 when positioned in the gas distribution assembly. This is representative of one possible configuration that allows the assembly 300 to support its own weight and other configurations are within the scope of the disclosure.

Figure 9:
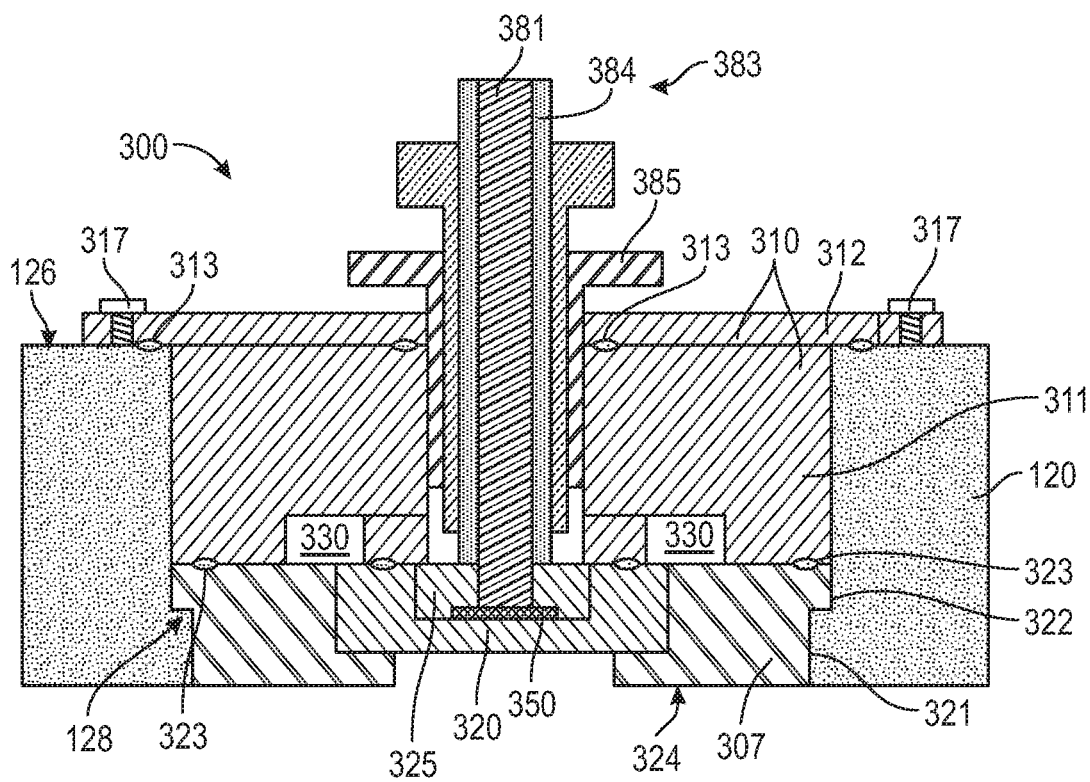
FIG. 9 shows a schematic cross-sectional view of a plasma source assembly in accordance with one or more embodiments of the disclosure.

FIG. 9 illustrates a cross-sectional view of one or more embodiment of a plasma source assembly 300 in which the ground electrode 310 and the housing 307 are tiered. The ground electrode 310 is shown as a lower portion 311 and upper portion 312 that are separate components with o-rings 313. The lower portion 311 and upper portion 312 can be connected by any suitable components including, but not limited to, removable hardware (e.g., bolts) or permanent bonds (e.g., solder bond). The illustrated embodiment provides two regions in which the assembly 300 can be supported within the gas distribution assembly 120. The tiered housing 307 shown rests on a ledge 128 formed in the gas distribution assembly 120 and the upper portion 312 of the ground electrode 310 rests on a top surface 126 of the gas distribution assembly 120. In the embodiment illustrated, the assembly 300 is held in place by bolts 317 passing through upper portion 312 into the gas distribution assembly 120.

The dielectric 320 illustrated in FIG. 9 has multiple parts to allow the dielectric 320 to be opened to access the inner portion including strip-line powered electrode 350. The ground electrode 310 and the dielectric 320 can be connected with O-ring 323 to form a gas-tight seal for gas path 330, as discussed below. For ease of illustration, the various O-rings are not shown in other views and illustrated embodiments; however, the skilled artisan will recognize the general usefulness of an O-ring and suitable locations in which an O-ring could be used.

Figure 10:
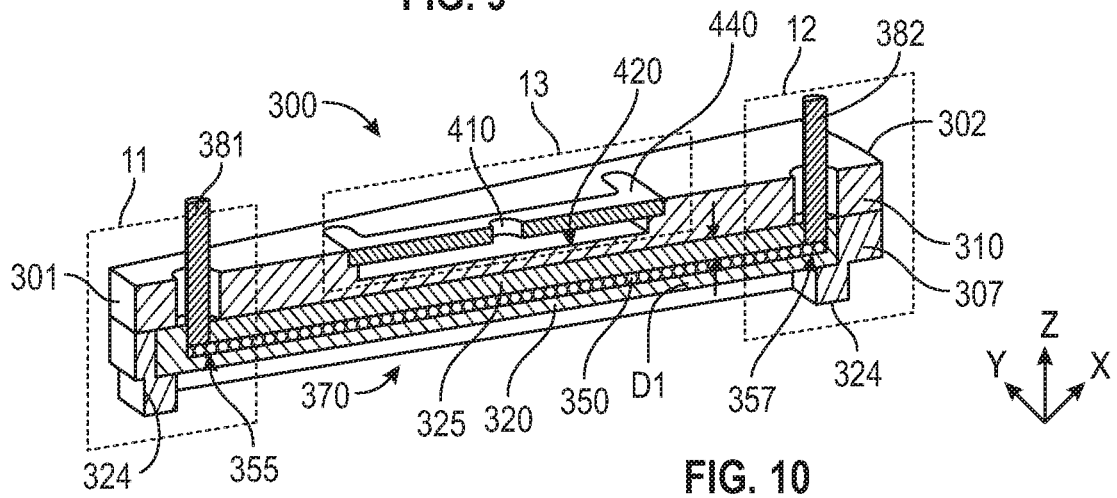
FIG. 10 shows a cross-sectional view of the plasma source assembly of FIG. 8 along line 10-10'.

FIG. 10 illustrates a cross-sectional view of the plasma source assembly 300 of FIG. 8 taken along line 10-10'. The plasma source assembly 300 has a powered electrode 350 with a first end 355 and a second end 357. The powered electrode 350 extends along the elongate axis of the plasma source assembly 300 so that the first end 355 is adjacent the inner peripheral edge 301 and the second end 357 is adjacent the outer peripheral edge 302. As used in this manner, the term "adjacent" means that the first component is positioned near or next to the second component.

Figure 10A:
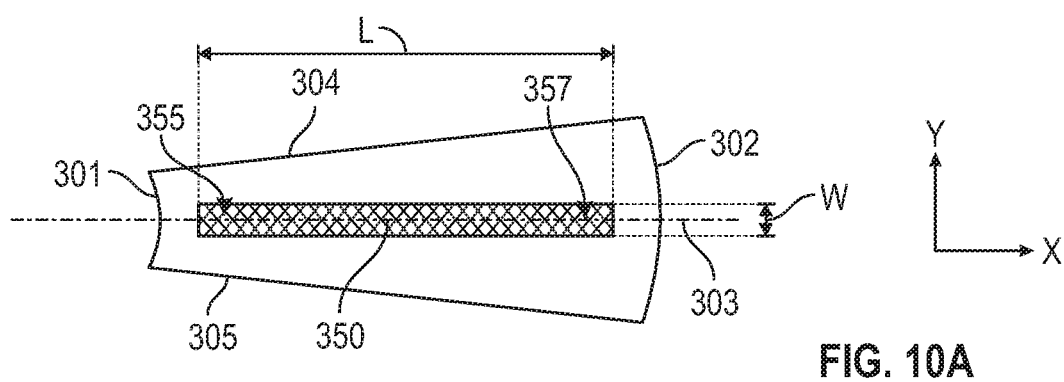
FIG. 10A shows a bottom schematic view of a plasma source assembly in accordance with one or more embodiment of the disclosure.

FIG. 10A shows a schematic representation of a wedge-shaped plasma assembly 300 with an inner peripheral edge 301 and outer peripheral edge 302. The elongate axis 303 of the assembly 300 is marked as a dotted line that extends through the inner peripheral edge 301 and the outer peripheral edge 302 and is centered between the first edge 304 and the second edge 305. The powered electrode 350 has a length L and a width W. The length L is measured from the first end 355 to the second end 357. The width W is measured perpendicular to the elongate axis 303 in a plane similar to a plane formed by the front face 324 of the assembly 300, as shown in FIG. 9. The powered electrode 350 has an axis that extends along the length of the powered electrode from the first end to the second end. In some embodiments, the powered electrode 350 has sides that are substantially parallel. Referring to FIG. 10A, the sides extend between ends 355, 357 of the powered electrode. The term "substantially parallel" means that a major plane formed by one side is within ±10° of the major plane formed by the other side. In some embodiments, the width W of the powered electrode 350 remains substantially the same (e.g., within 10% of the average) across the length L of the electrode 350. In some embodiments, the sides of the electrode 350 are tilted inward at either the top or the bottom of the electrode to form a trapezoidal shaped cross-section.

The powered electrode 350 can be made of any suitable material that can withstand operating temperatures. In some embodiments, the powered electrode 350 comprises one or more of tungsten (W), molybdenum (Mo) or tantalum (Ta). In some embodiments, the powered electrode 350 comprises, consists essentially of, or consists of tungsten. As used in this manner, the term "consists essentially of" means that the powered electrode 350 is greater than or equal to about 95%, 98% or 99% of the stated material, on an atomic basis. In some embodiments, the powered electrode 350 comprises, consists essentially of, or consists of molybdenum. In some embodiments, the powered electrode 350 comprises, consists essentially of, or consists of tantalum.

The width W of the powered electrode 350 can be any suitable width. In some embodiments, the powered electrode 350 has a width W in the range of about 2 mm to about 50 mm, or in the range of about 4 mm to about 40 mm, or in the range of about 5 mm to about 30 mm, or in the range of about 7 mm to about 20 mm, or in the range of about 8 mm to about 15 mm. In some embodiments, the width W of the powered electrode 350 is about 10 mm.

In some embodiments, the width W of the powered electrode 350 changes from the first end 355 to the second end 357. In some embodiments, the shape of the width W of the powered electrode 350 conforms to the shape of the powered electrode 300. For example, a wedge-shaped assembly 300 may have a wedge-shaped powered electrode 350 in which the proportions of the widths at the outer edge to the width and the inner edge are similar.

The ground electrode 310 is positioned on a first side of the powered electrode 350. The position of the ground electrode 310 may be referred to as above the powered electrode 350. However. the uses of relative terms like "above", "below" and the like are not intended to represent a specific physical relationship, rather a relative relationship is intended. For example, the coordinate axis in FIG. 10 indicates that the ground electrode 310 is positioned higher in the Z-axis than the powered electrode 350. In some embodiments, the first side of the powered electrode 350 is the side of the powered electrode 350 different in the Z-axis than the second side of the powered electrode 350.

The ground electrode 310 can be made of any suitable material including, but not limited to, aluminum, stainless steel and copper. The ground electrode 310 can have any suitable electrical characteristics. In some embodiments, the ground electrode is a conductive material in electrical contact with electrical ground.

As illustrated in FIG. 10, the ground electrode 310 can be spaced from the powered electrode 350 by a distance $D_1$. The distance $D_1$ can be any suitable distance to separate the ground electrode 310 from the powered electrode 350 to prevent direct electrical contact therebetween. In some embodiments, the ground electrode 310 is spaced from the powered electrode 350 by a second dielectric 325. The second dielectric 325 can be the same as the dielectric 320 or can be a different material. The dielectric 320 and/or second dielectric 325 can be made of any suitable material including, but not limited to, aluminum oxide, silicon oxide, silicon nitride, ceramic, quartz, air. In some embodiments, the dielectric 320 and/or second dielectric 325 comprises a combination of a dielectric material and an air gap. The dielectric 320 on the second side of the powered electrode 350 has an inner face 326 adjacent to or facing the powered electrode 350 and an outer face 327 opposite the inner face 326.

In the embodiment illustrated in FIG. 10, the dielectric 320 is supported and/or within housing 307. The dielectric 320 and second dielectric 325 enclose the powered electrode 350 to prevent direct electrical contact with either the ground electrode 310 or a gas or component on the side of the powered electrode 350 opposite the ground electrode 310. In the illustrated embodiment, the dielectric 320 separates the powered electrode 350 from a gas in the gas channel 370.

A first microwave generator 361 (see FIG. 7) is electrically coupled to the first end 355 of the powered electrode 350 through a first feed 381. The first feed 381 is made of any suitable conductive material that can transmit power from the first microwave generator 361 to the powered electrode 350. In the embodiment illustrated in FIG. 10 and detail view of FIG. 11, the first feed 381 passes through the ground electrode 310 through opening 314 without making electrical contact with the ground electrode 310.

A second microwave generator 362 (see FIG. 7) is electrically coupled to the second end 357 of the powered electrode through a second feed 382. The second feed 382 is made of any suitable conductive material that can transmit power from the second microwave generator 362 to the powered electrode. In the embodiment illustrated in FIG. 10 and detail view of FIG. 12, the second feed 382 passes through the ground electrode 310 through opening 315 without making electrical contact with the ground electrode 310.

The first feed 381 and the second feed 382 can be isolated from electrical contact with the ground electrode 310 by any suitable technique. Referring back to FIG. 9, the first feed 381 is illustrated as a coaxial feed line 383. The coaxial feed line 383 includes an inner conductor (first feed 381) with an insulator 384 and an outer conductor 385 arranged in a coaxial configuration. The outer conductor 385 is in electrical contact with the ground electrode 310 to form a complete electrical circuit. In the illustrated embodiment, the insulator 384 terminates at the second dielectric 325. However, the insulator 384 can terminate at any suitable point including, but not limited to, the powered electrode 350. The second feed 382 of some embodiments includes the same components as the first feed 381.

Figure 11:
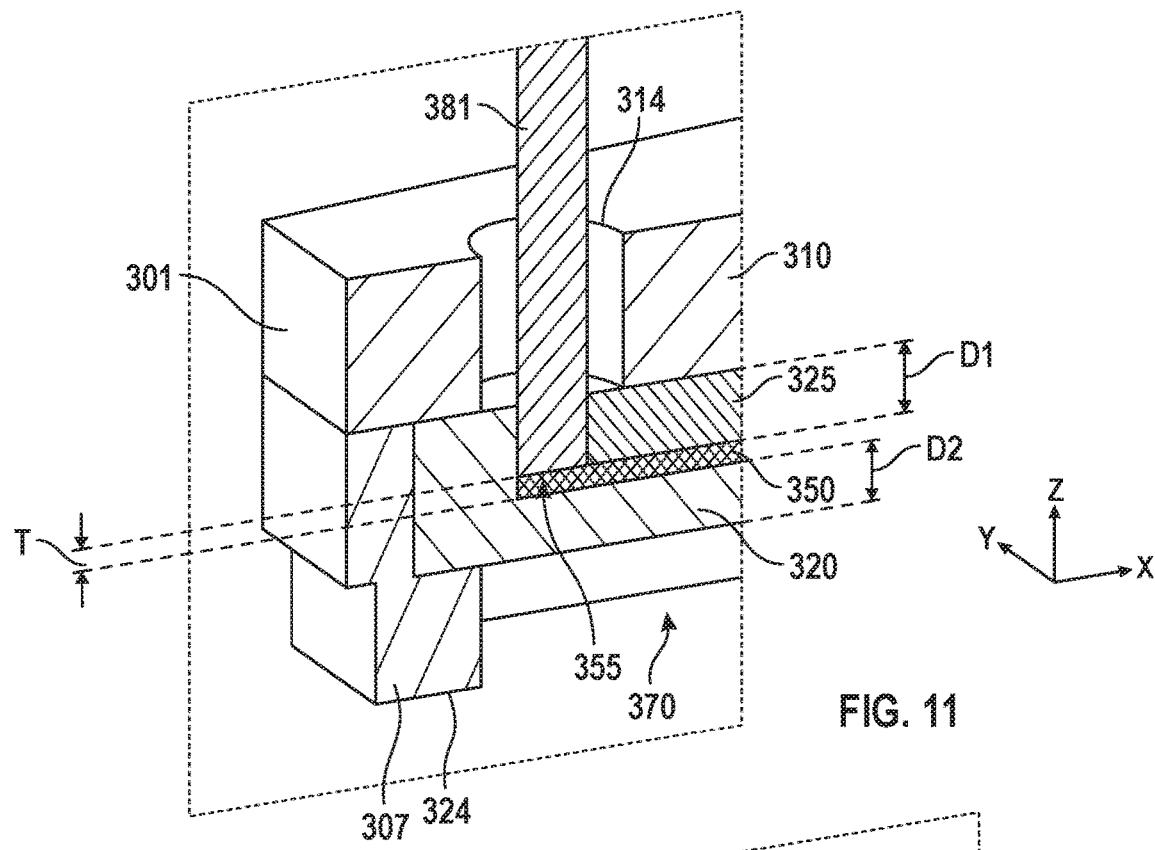
FIG. 11 shows a detail view of region 11 of FIG. 10.
Figure 12:
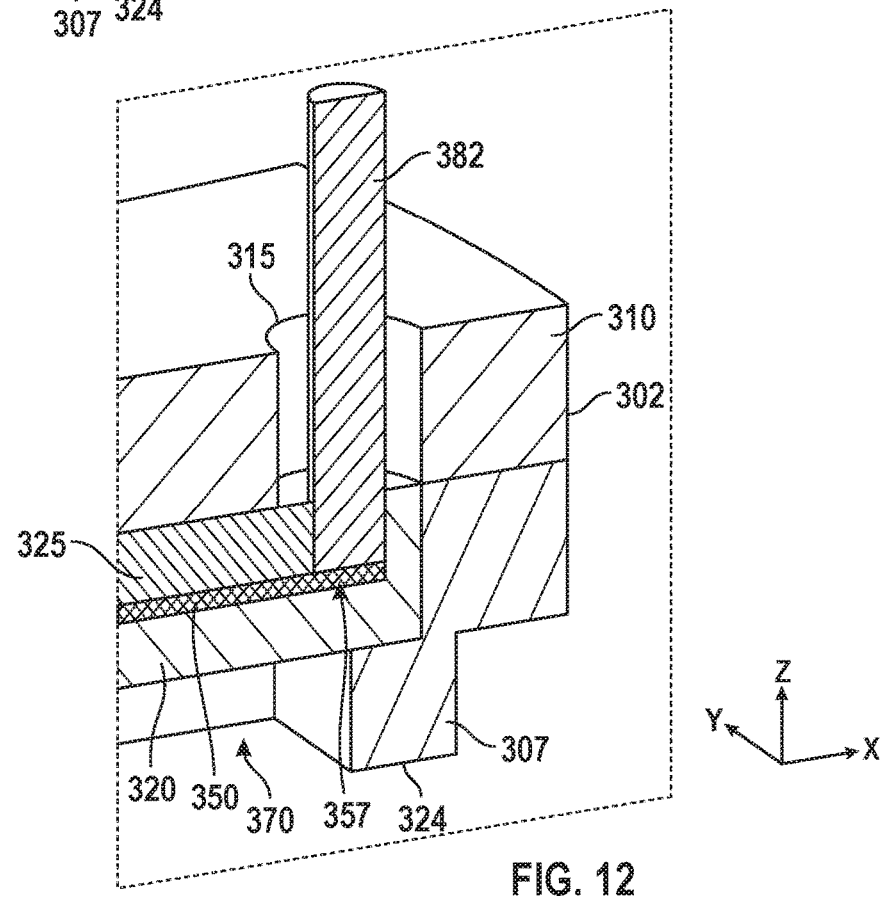
FIG. 12 shows a detail view of region 12 of FIG. 10.

Referring to detail view of FIG. 11, the powered electrode 350 can be separated from the ground electrode 310 by distance $D_1$ and separated from the gas channel 370 by distance $D_2$. The distance $D_1$ and distance $D_2$ can be the same or different dimensions. In some embodiments, the distance $D_1$ and distance $D_2$ are in the range of about 4 mm to about 15 mm, or in the range of about 5 mm to about 14 mm, or in the range of about 7 mm to about 13 mm, or in the range of about 9 mm to about 12 mm, or about 11 mm.

In some embodiments, the distance $D_1$ remains substantially the same between the first end 355 and the second end 357. As used in this manner, the term "substantially the same" means that the thickness does not vary by more than 10%, 5%, 2% or 1% relative to the average thickness from the first end 355 to the second end 357. In some embodiments, the distance $D_1$ changes between the first end 355 and the second end 357. For example, in some embodiments, the second dielectric 325 is thicker near the second end 357 than the first end 355 so that he distance $D_1$ is greater at the second end 357 than the first end 355. In some embodiments, the second dielectric 325 is thinner near the second end 357 than the first end 355.

In some embodiments, the distance $D_2$ remains substantially the same between the first end 355 and the second end 357. In some embodiments, the distance $D_2$ changes between the first end 355 and the second end 357. For example, in some embodiments, the second dielectric 325 is thicker near the second end 357 than the first end 355 so that he distance $D_2$ is greater at the second end 357 than the first end 355. In some embodiments, the second dielectric 325 is thinner near the second end 357 than the first end 355.

Figure 13:
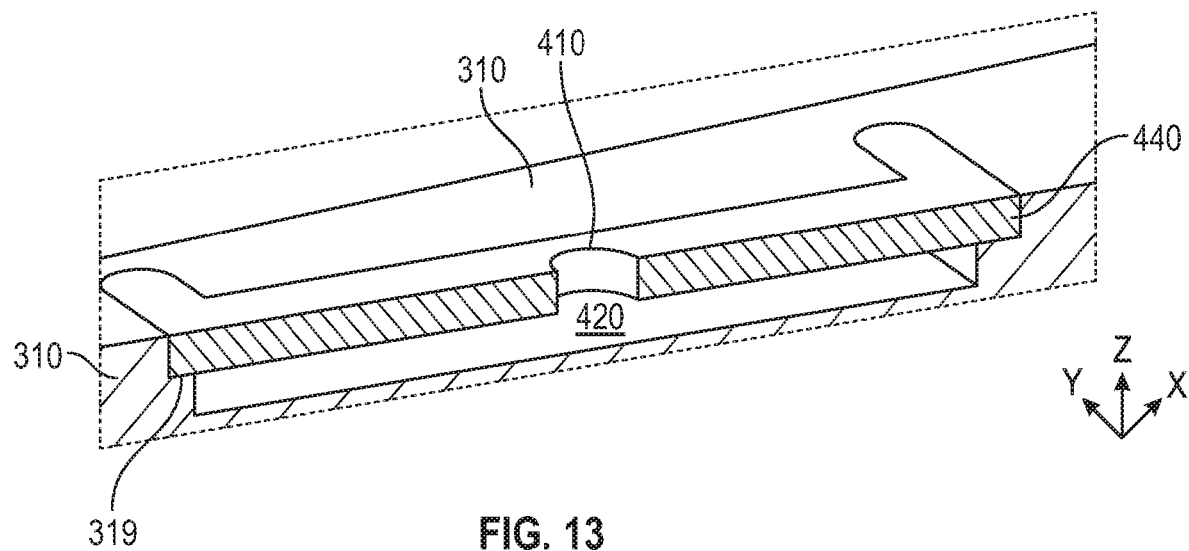
FIG. 13 shows a detail view of region 13 of FIG. 10.

Referring to FIGS. 10 and detail view FIG. 13, some embodiments of the plasma source assembly 300 include a gas inlet 410 in the top of the ground electrode 310. As used in this manner, the "top" of the ground electrode 310 refers to a surface of the ground electrode 310 furthest from powered electrode 350 and does not imply a physical orientation. The gas inlet 410 of some embodiments is in fluid communication with the gas channel 370 at the bottom of the assembly 300 located opposite the top of the ground electrode 310 so that a gas can flow from the top of the assembly 300, through the body of the assembly and into the process region of the processing chamber located below the assembly 300.

Figure 14:
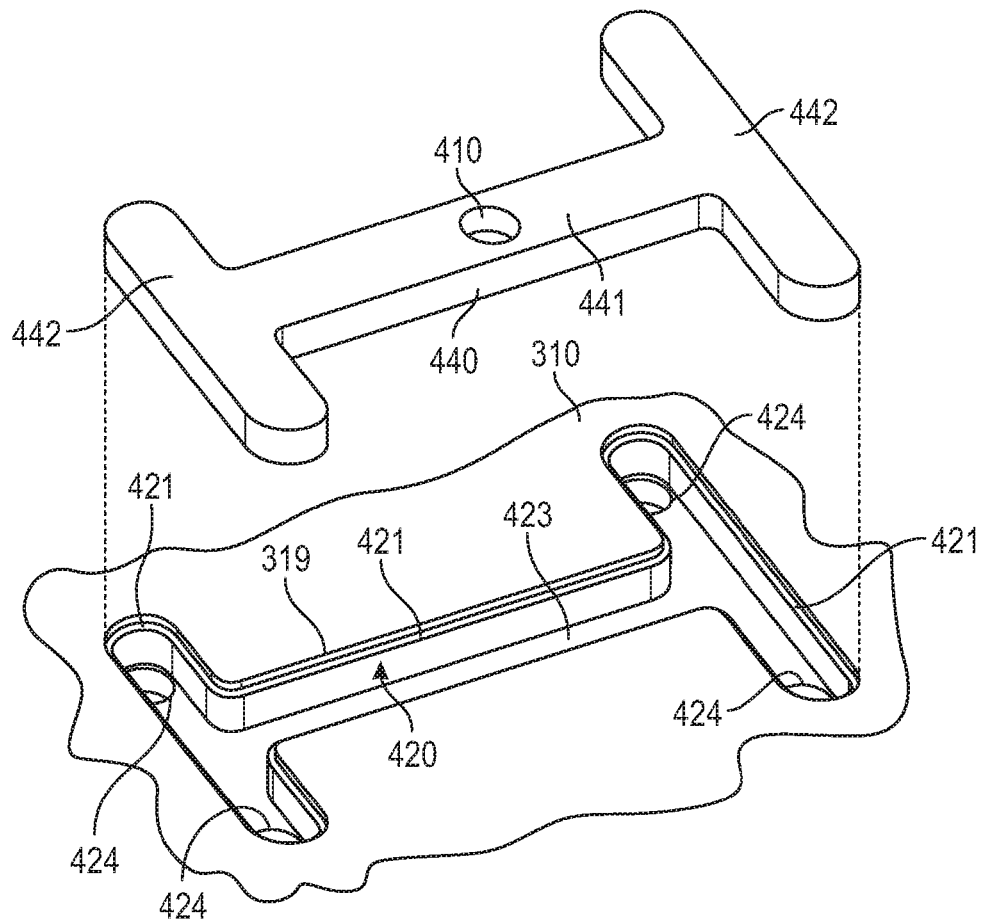
FIG. 14 shows a partial perspective view of a gas inlet plate and recess of a plasma source assembly in accordance with one or more embodiments of the disclosure.
Figure 15:
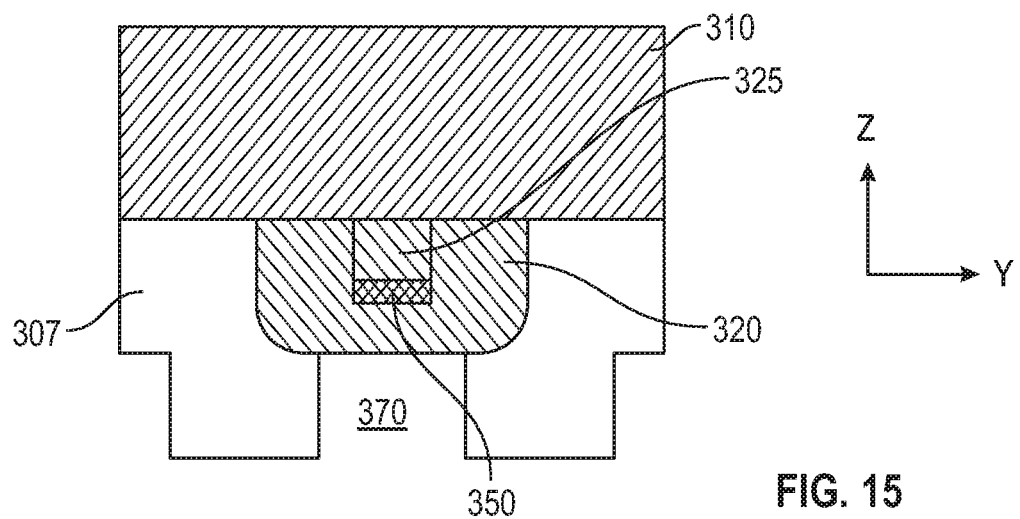
FIG. 15 shows a cross-sectional view of the plasma source assembly of FIG. 8 taken along line 15-15'.
Figure 16:
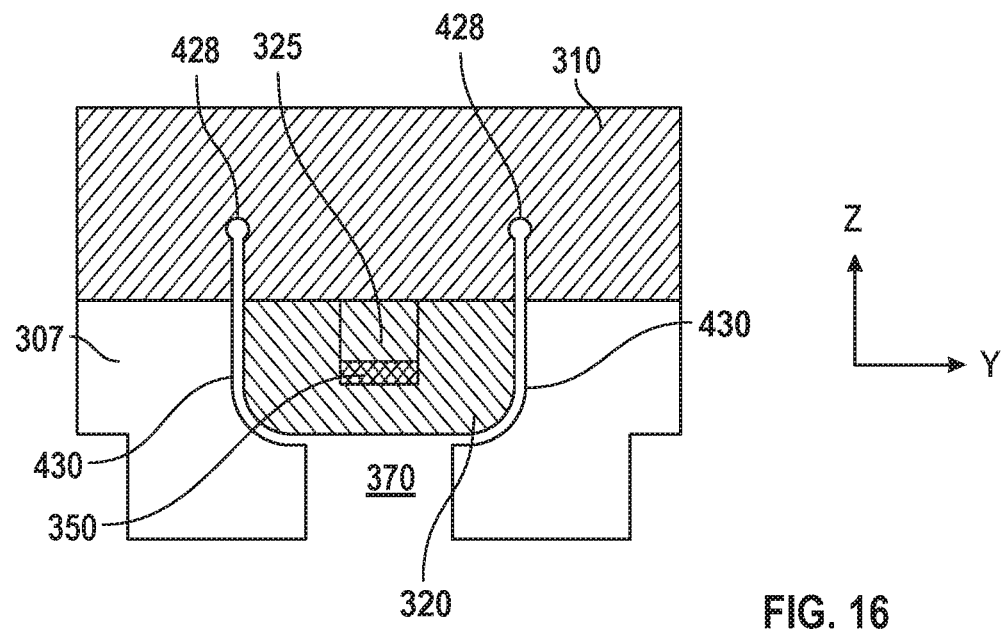
FIG. 16 shows a cross-sectional view of the plasma source assembly of FIG. 8 taken along line 16-16'.
Figure 17:
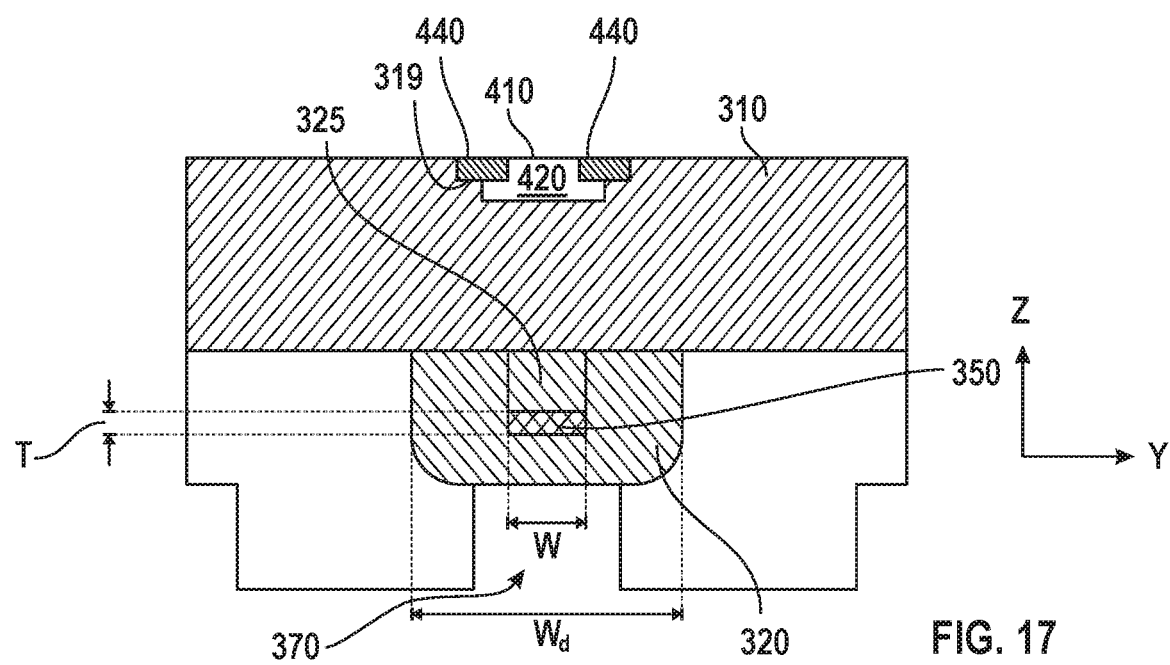
FIG. 17 shows a cross-sectional view of the plasma source assembly of FIG. 8 taken along line 17-17'.

Referring to FIGS. 13 through 17, the gas flow path 405 of some embodiments is shown. FIG. 15 is a cross-sectional view taken along line 15-15' of FIG. 8 and shows a portion of the end of the assembly 300 at the first end 355 of the powered electrode 350. FIG. 16 is a cross-sectional view taken along line 16-16' of FIG. 8 between the first end 355 of the powered electrode 350 and a centrally located gas inlet 410. FIG. 17 is a cross-sectional view taken along line 17-17' of FIG. 8 at a centrally located gas inlet 410. While the embodiments shown have the gas inlet 410 at the center of the length of the powered electrode 350, it will be understood that this is merely representative of on possible configuration.

As shown in FIGS. 13 and 14, some embodiments include a gas inlet plate 440 that can fit into a recess 319 in the ground electrode 310, or a housing if separate from the ground electrode 310. The gas insert plate 440 can be any suitable shape or size. In the embodiment illustrated, the gas insert plate 440 is shaped like an I-beam with a center spar 441 and two end spars 442. The gas inlet 410 is located in the middle of the center spar 441 so that the conductance of a gas flowing through the gas inlet 410 is about the same at each of the end spars 442.

The gas insert plate 440 sits on a ledge 421 below the top of the ground electrode 310. The width of the ledge 421 can by any suitable width to support the edges of the gas insert plate 440. A gas flowing through the gas inlet 410 passes into gas volume 420 defined by the bottom 423 of the recess 319 and the gas insert plate 440 and through holes 424 below the ends of the end spars 442.

Figure 18:
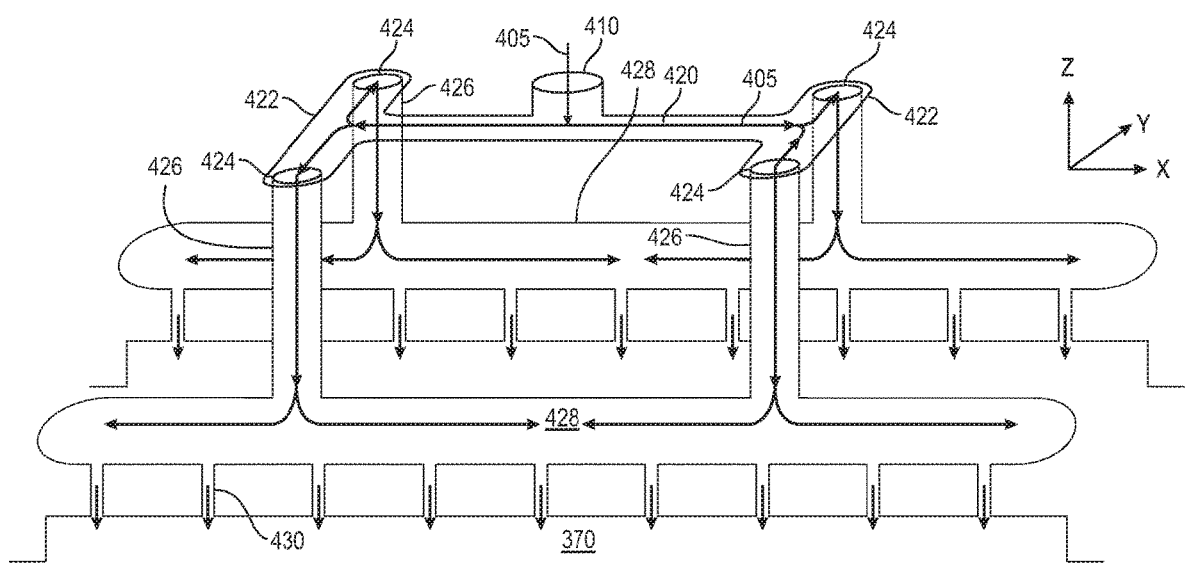
FIG. 18 shows a schematic view of a gas flow path through a plasma source assembly in accordance with one or more embodiment of the disclosure.

The gas flow path 405 is shown in a schematic representation of FIG. 18. The gas flowing through holes 424 pass through tubes 426 into one or more plenum 428 extending along the elongate axis. The one or more plenum 428 are in fluid communication with one or more gas conduits 430 to provide a flow of gas from the gas inlet plate 440 to flow through the ground electrode 310 and the dielectric 320 to a gas channel 370 extending along the elongate axis of the plasma source assembly 300. The gas channel 370 can be any suitable depth, measured from the front face 324 of the housing 307 or the dielectric 320. In some embodiments, the gas channel 370 has a depth in the range of about 5 mm to about 30 mm, or in the range of about 10 mm to about 25 mm, or in the range of about 15 mm to about 20 mm.

Figure 16A:
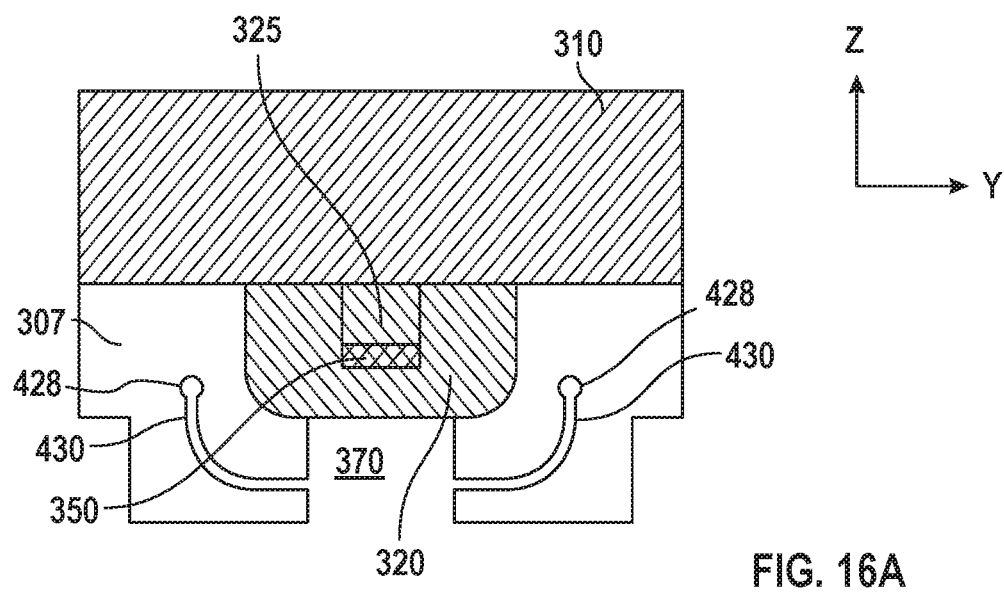
FIG. 16A shows a cross-sectional view of a plasma source assembly of FIG. 8 taken along line 16-16' according to one or more embodiment.

The gas volume 420 and gas insert plate 440 can be seen in cross-sectional view of FIG. 17. Two plenums 428 and conduits 430 are shown in the cross-sectional view of FIG. 16. The conduits 430 are in fluid communication with the gas channel 370. In the cross-sectional views of FIGS. 15 through 17, the housing 307 and dielectric 320 form the boundaries to the conduits 430. In some embodiments, the conduits 430 are formed completely in the dielectric 320. In some embodiments, as shown in FIG. 16A, the conduits 430, and optionally the plenums 428, are formed completely in the metal housing 307. The skilled artisan will recognize that any of the disclosed configurations can have the conduits 430 completely within the metal housing 307.

Referring to FIG. 17, the cross-sectional shape of the powered electrode is shown as a rectangle. The cross-sectional shape of the powered electrode 350 can be any suitable shape. For example, the powered electrode 350 can be cylindrical extending from the first end to the second end and the cross-sectional shape would be round or oval. In some embodiments, the powered electrode is a flat conductor. As used in this manner, the term "flat conductor" means a conductive material with a rectangular prism shape in which the cross-section is a rectangle, like FIG. 17. A flat conductor has a height or thickness T. The thickness T of the can be any suitable thickness depending on, for example, the powered electrode 350 material. In some embodiments, the powered electrode 350 has a thickness in the range of about 5 µm to about 5 mm, 0.1 mm to about 5 mm, or in the range of about 0.2 mm to about 4 mm, or in the range of about 0.3 mm to about 3 mm, or in the range of about 0.5 mm to about 2.5 mm, or in the range of about 1 mm to about 2 mm.

In some embodiments, the width $W_d$ of the dielectric 320 and/or second dielectric 325 can remain the same or vary along the length of the electrode. In some embodiments, the dielectric 320 (optionally including the second dielectric 325) has a uniform width $W_d$ from the first end 355 to the second end 357 of the powered electrode 350. In some embodiments, the dielectric 320 has sides that are substantially parallel (like that shown in FIG. 9). The sides extend between ends 355, 357 of the powered electrode. The term "substantially parallel" means that a major plane formed by one side is within ±10° of the major plane formed by the other side. The major plane excludes portions of the side that are curved, as shown in FIG. 15. In some embodiments, the width $W_d$ of the dielectric 320 remains substantially the same (e.g., within 10% of the average) across the length L of the electrode 350. In some embodiments, the width Wd of the dielectric 320 varies with the width of the housing 307 so that a ratio of the width of the dielectric 320 to the width of the housing 307 remains about the same from the inner end to the outer end of the housing. In some embodiments, the width $W_d$ of the dielectric 320 does not exceed λ□₀, where lambda (λ) is the microwave wavelength.

Referring to FIG. 7, the first microwave generator 361 is electrically coupled to the first end 355 of the powered electrode 350 through a first feed 381 and the second microwave generator 362 is electrically coupled to the second end 357 of the powered electrode 350 through a second feed 382. The first feed 381 and the second feed 382 are described above with respect to FIG. 9. The first microwave generator 361 operates at a first frequency f1 and the second microwave generator 362 operates at a second frequency f2. In some embodiments, the first frequency f1 and the second frequency f2 are in the range of about 300 MHz to about 300 GHz, or in the range of about 900 MHz to about 930 MHz, or in the range of about 1 GHz to about 10 GHz, or in the range of about 1.5 GHz to about 5 GHz, or in the range of about 2 GHz to about 3 GHz, or in the range of about 2.4 GHz to about 2.5 GHz, or in the range of about 2.44 GHz to about 2.47 GHz, or in the range of about 2.45 GHz to about 2.46 GHz. In some embodiments, the frequency f1 and frequency f2 are each about 915 MHz±15%, or 915 MHz±10%. In some embodiments, the frequency f1 is within 0.05 GHz of the frequency f2. In some embodiments, the frequency f1 is different than the frequency f2 (i.e., difference greater than 5 MHz for frequencies in the 900-930 MHz range or greater than 0.05 GHz for frequencies in the 1 GHz to 10 GHz range). In some embodiments, the frequency f1 is different than the frequency f2 and each is in the range of about 900 MHz to about 930 MHz, or in the range of about 2.4 GHz to about 2.5 GHz, or 2.45 GHz±10%, or 2.45 GHz±5%, or 915 MHz±15%, or 915 MHz±10%.

The first microwave generator 361 and the second microwave generator 362 can operate at any suitable power. The power of the microwave generators can be independently controlled to tune the plasma parameters. In some embodiments, the power of the microwave generators is in the range of about 100 W to about 5 kW, or in the range of about 500 W to about 2 kW, or about 1 kW.

In use, microwave power can be applied to both ends of the powered electrode 350 using the first microwave generator 361 and the second microwave generator 362. When power is not absorbed by the plasma 353, the power can be routed to dummy loads (also referred to as "matched termination load") via circulators at the microwave generators outputs. This can be through a built-in or external circulator. In some embodiments, the second microwave generator 362 is the matched termination load of the first microwave generator 361 so that one generator can provide power to both the first feed 381 and the second feed 382. In some embodiments, the second microwave generator 362 is a dummy-load.

Figure 19:
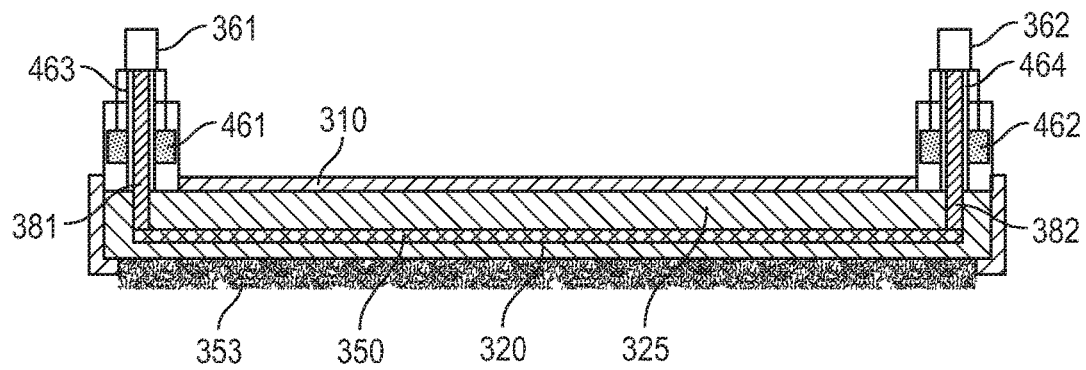
FIG. 19 shows a cross-sectional schematic view of a plasma source assembly in accordance with one or more embodiments of the disclosure.

FIG. 19 shows a schematic representation of one or more embodiment of the disclosure in which a first sliding short 461 is positioned adjacent the first feed 381 and a second sliding short 462 is positioned adjacent the second feed 382. The sliding shorts 461, 462 of some embodiments are coaxial sliding-short type tuners positioned around the coaxial feeds. In some embodiments, a first movable short 463 and a second movable short 464 are used with the first sliding short 461 and the second sliding short 462 to form an "L-type" matching network at the power input. The tuning sections (where the sleeves and shorts are positioned) can be located on the atmospheric side of the power connection.

Figure 20:
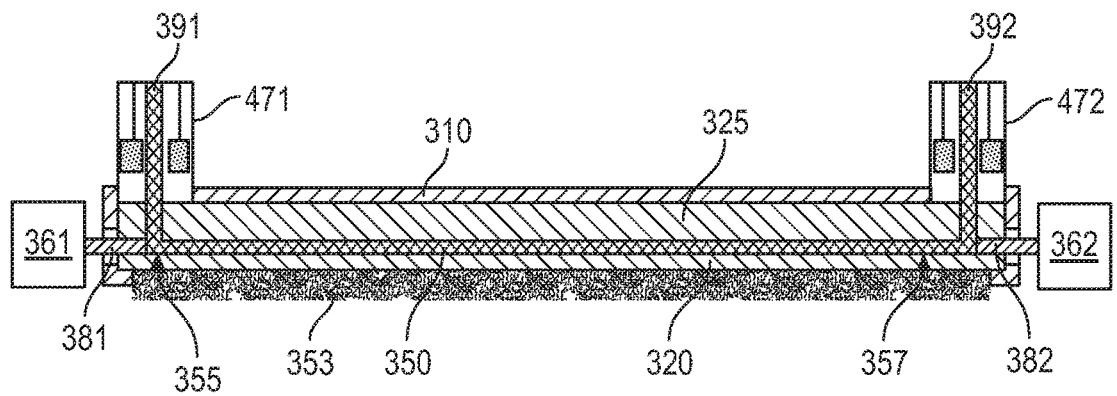
FIG. 20 shows a cross-sectional schematic view of a plasma source assembly in accordance with one or more embodiments of the disclosure.

FIG. 20 shows a schematic representation of one or more embodiment of the disclosure in which a coaxial sliding-short type tuner 471, 472 is positioned on a first leg 391 adjacent the first feed 381 at the first end 355 of the and on a second leg 392 adjacent the second feed 382 at the second end 357. The first leg 391 and the second leg 392 can be shorted coaxial lines of adjustable lengths. The sliding metal shorts can form a variable transmission-line tuning element. The microwave generators are shown positioned approximately coaxial with the powered electrode 350 and the legs 391, 392 are at an angle to the axis of the powered electrode 350.

Figure 21:
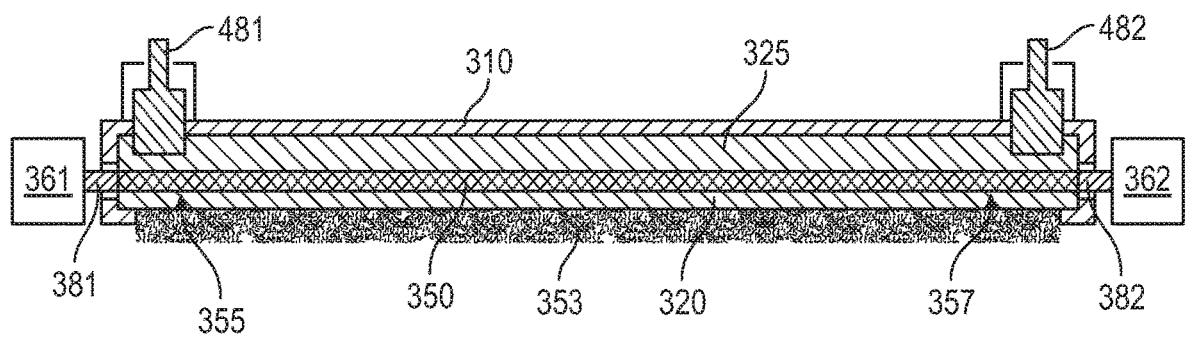
FIG. 21 shows a cross-sectional schematic view of a plasma source assembly in accordance with one or more embodiments of the disclosure.

FIG. 21 shows a schematic representation of one or more embodiment of the disclosure in which a first stub tuner 481 is positioned adjacent the first feed 381 at the first end 355 of the powered electrode 350 and a second stub tuner 482 adjacent the second feed 382 at the second end 357 of the powered electrode 350. The stub tuners 481, 482 can be positioned at any point along the length of the powered electrode 350 and can be moved closer to or further from the powered electrode 350. For example, the second stub tuner 482 is illustrated as being closer to the powered electrode 350 than the first stub tuner 481. The first microwave generator 361 and second microwave generator 362 are electrically coupled to the powered electrode 350 in approximately a coaxial arrangement. In some embodiments, one or more of the stub tuners have a resistance in the range of about 20 ohms to about 80 ohms, or in the range of about 40 ohms to about 60 ohms, or about 50 ohms to minimize power reflection.

Figure 22A:
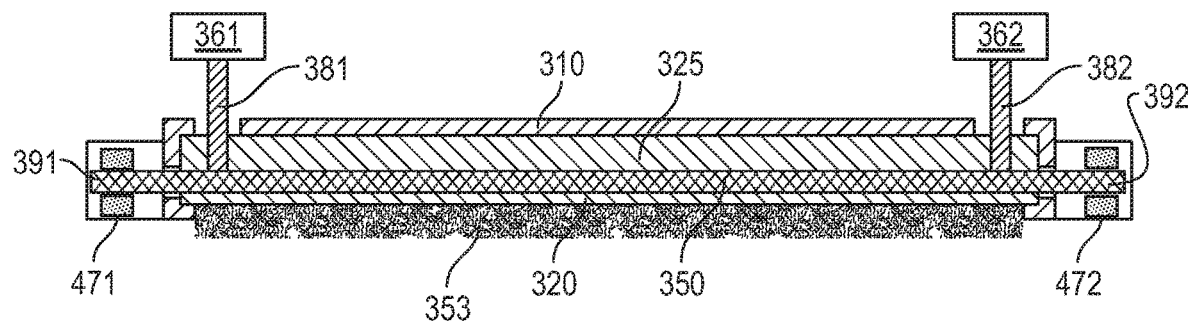
FIG. 22A shows a cross-sectional schematic view of a plasma source assembly in accordance with one or more embodiments of the disclosure.
Figure 22B:
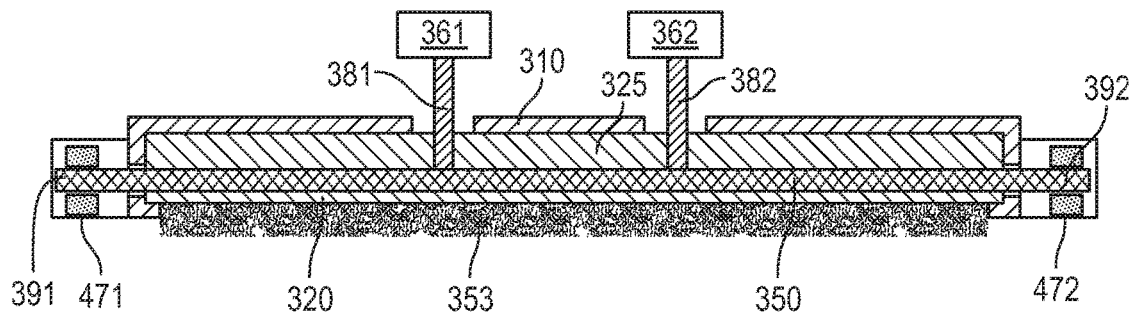
FIG. 22B shows a cross-sectional schematic view of the plasma source assembly of FIG. 22A with the feeds moved toward the center of the length of the powered electrode in accordance with one or more embodiment of the disclosure.

FIG. 22A shows a schematic representation of one or more embodiment of the disclosure with a similar configuration to that of FIG. 20. Here, the legs 391, 392 are illustrated as approximately coaxial with the powered electrode 350 and the coaxial sliding-short type tuner 471, 472 are coaxial oriented. The first feed 381 and second feed 382 are at an angle to the axis of the powered electrode 350. FIG. 22B shows a schematic representation of the embodiment of FIG. 22A with the first feed 381 and second feed 382 moved toward a center of the length of the powered electrode 350. Moving the feeds to the center of the length of the electrode may increase the power available to generate the plasma while the tuners can control the plasma profile at the ends of the powered electrode.

Figure 23A:
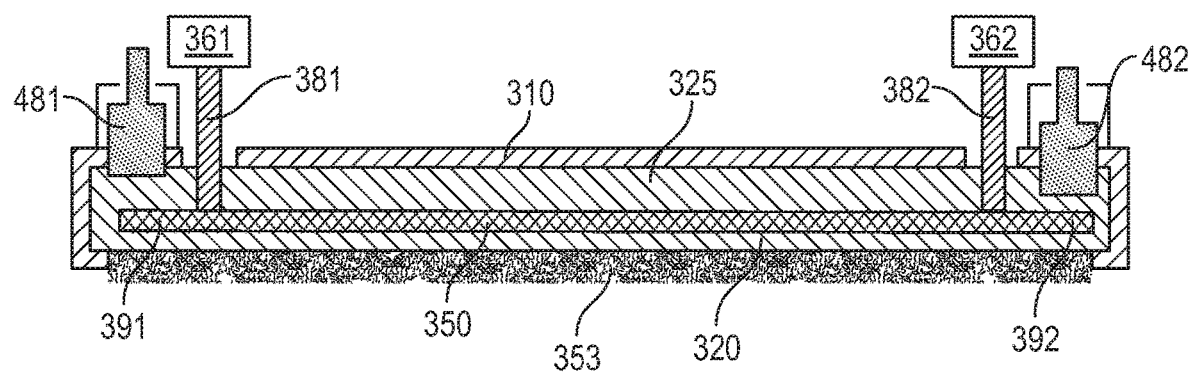
FIG. 23A shows a cross-sectional schematic view of a plasma source assembly in accordance with one or more embodiments of the disclosure.
Figure 23B:
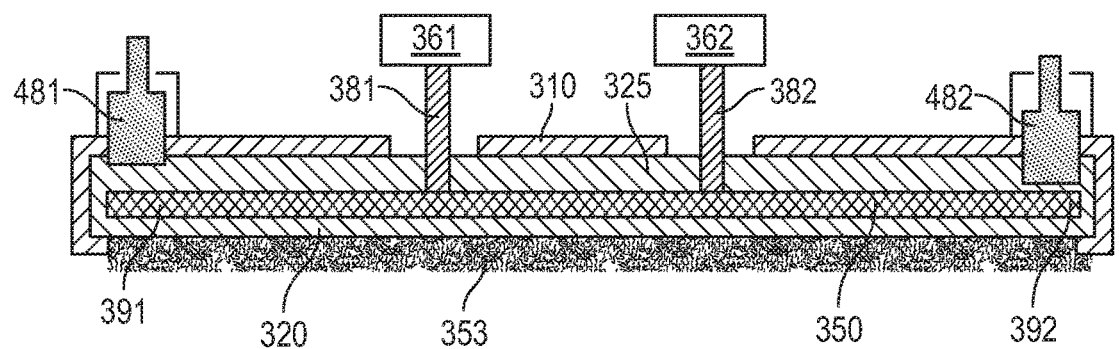
FIG. 23B shows a cross-sectional schematic view of the plasma source assembly of FIG. 23A with the feeds moved toward the center of the length of the powered electrode in accordance with one or more embodiment of the disclosure

FIG. 23A shows a schematic representation of one or more embodiment of the disclosure with a similar configuration to that of FIG. 21. Here, the legs 391, 392 are illustrated as approximately coaxial with powered electrode 350 and the stub tuners 481, 482 are located adjacent the legs 391, 392 outside of the first feed 381 and second feed 382. FIG. 23B shows a schematic representation of the embodiment of FIG. 23A with the first feed 381 and the second feed 382 moved toward a center of the length of the powered electrode 350, similar to the differences in FIGS. 22A and 22B. The tuners illustrated in FIGS. 23A and 23B can be in a horizontal orientation as well as the illustrated vertical orientation.

In some embodiments, similar to FIG. 23A without the stub tuners 481, 482, the powered electrode 350 extends beyond each of the first feed 381 and the second feed 382 by an amount about 1/16λ, 1/8λ or 1/4λ. In some embodiments, the powered electrode 350 extends beyond each of the first feed 381 and the second feed 382 by an amount less than or equal to about 1/16λ, 1/8λ or 1/4λ. For example, the embodiment illustrated in FIG. 23A has legs 391, 392 outside the first feed 381 and second feed 382, respectively. These portions of the powered electrode 350 that are not between the feeds can be referred to as legs, extensions or stubs. In some embodiments, the distance from the end of the powered electrode 350 to the nearest feed is in the range of about 0.1 mm to about 10 mm, or in the range of about 0.5 mm to about 8 mm, or in the range of about 1 mm to about 7.5 mm, or in the range of about 2 mm to about 6 mm, or in the range of about 3 mm to about 4.5 mm. In some embodiments, the length of the legs 391, 392 can be used as a tuning element to increase plasma uniformity.

Figure 24:
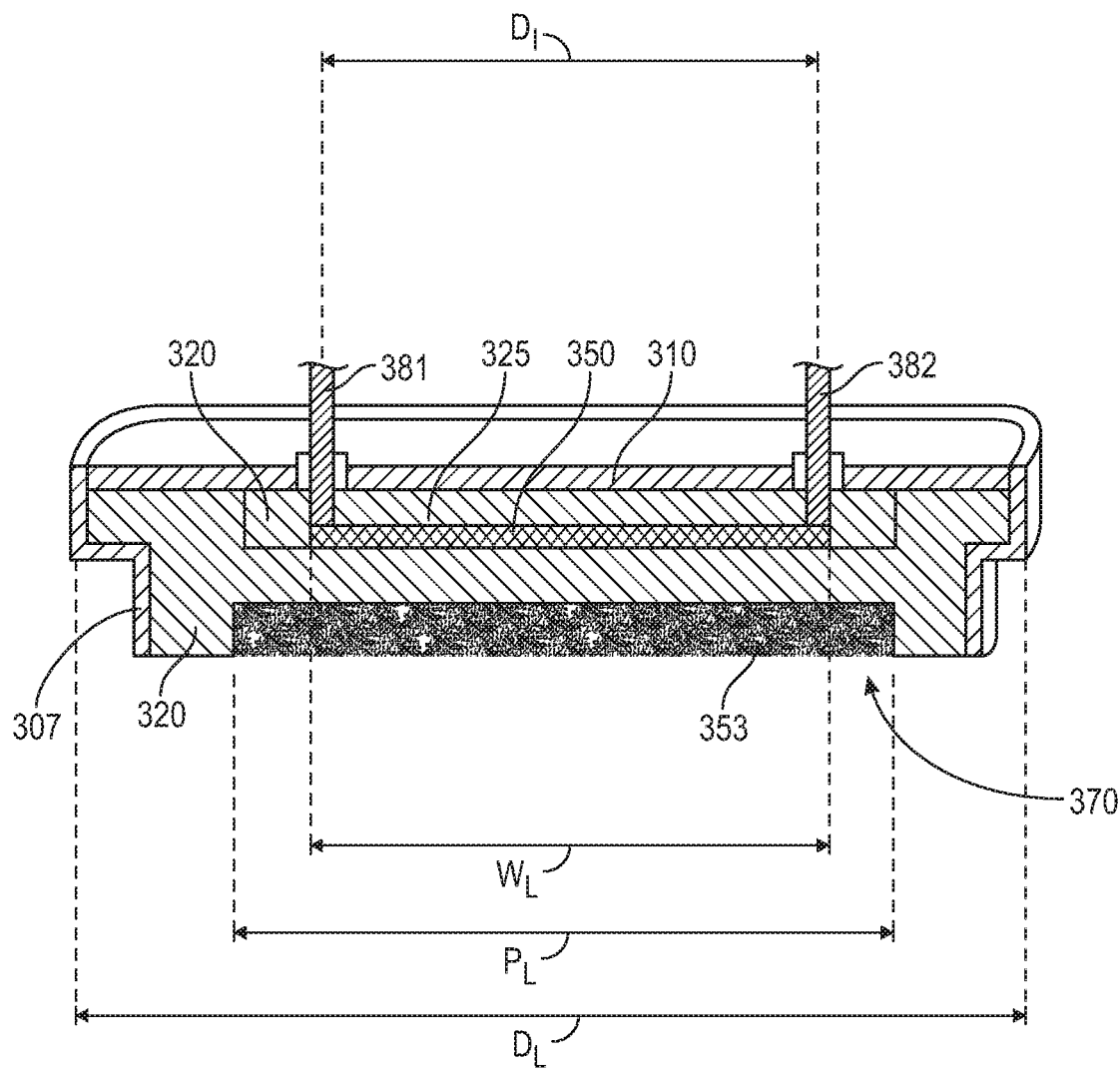
FIG. 24 shows a cross-sectional view of a plasma source assembly in accordance with one or more embodiment of the disclosure.

FIG. 24 shows a cross-sectional schematic of a plasma assembly 300 in accordance with one or more embodiment of the disclosure. Here, a housing 307 is around both the dielectric 320 and the ground electrode 310. The housing 307 can be conductive or non-conductive. The illustrated embodiment shows the measurements for the length $D_L$ of the dielectric 320, the length $P_L$ of the plasma 353 formed in the gas channel 370, the length $W_L$ of the powered electrode 350 and the distance $D_f$ between the power inputs. In some embodiments, the length $D_L$ is in the range of about 150 mm to about 500 mm, or in the range of about 200 mm to about 450 mm, or in the range of about 250 mm to about 400 mm, or in the range of about 300 mm to about 350 mm. In some embodiments, the length $P_L$ of the plasma is less than or equal to the length DL. In some embodiments, the length $P_L$ of the plasma is about 10 mm less than the length $D_L$. The length $W_L$ of the powered electrode 350 is about the length of the plasma $P_L$. In some embodiments, the length $W_L$ of the powered electrode 350 is less than or equal to about than the length of $D_L$ of the dielectric. The length $D_f$ between inputs is less than or equal to the length $W_L$ of the powered electrode 350.

Additional embodiments of the disclosure are directed to methods of generating or providing a plasma. A first microwave power is provided from a first microwave generator to a first end of a powered electrode and second microwave power is provided from a second microwave generator to a second end of the powered electrode. The first microwave power and the second microwave power operate at frequencies in the range of about 2.4 to about 2.5 GHz. The powered electrode is enclosed in a dielectric with a ground electrode on a first side of the powered electrode. A plasma is formed adjacent the dielectric on a second side of the powered electrode different from the first side.

During plasma generation, the pressure in the process chamber, or in the channel 370 can be any suitable temperature. In some embodiments, the pressure in the channel 370 is in the range of about 1 mTorr to about 100 Torr, or in the range of about 10 mTorr to about 10 Torr, or about 50 mT.

EXAMPLE

A plasma source assembly with dual microwave feed and a strip-line powered electrode was built and powered by two 1 kW generators operating at 2.4-2.5 GHz. The strip-line had an aluminum body, copper strip and quartz as a dielectric. The geometry was configured to maintain about 50 Ohm characteristic impedance in the circuit to minimize power reflections. The applicators were equipped with two stub tuners at each end. A plasma was generated with $N_2$ and $Ar/N_2$ over the plasma area of 340×75 mm at a gas pressure in the torr range.

A wedge-shaped plasma source assembly was constructed with a wedge shaped dielectric. The microwave feeds were straight to the top of the assembly, short-ended tunable coax lines were used in place of stub tuners and the strip material was molybdenum. Plasmas covering the pie were produced in $N_2$ and $Ar/N_2$ gas-mixtures up to several Torr.

Figure 25A:
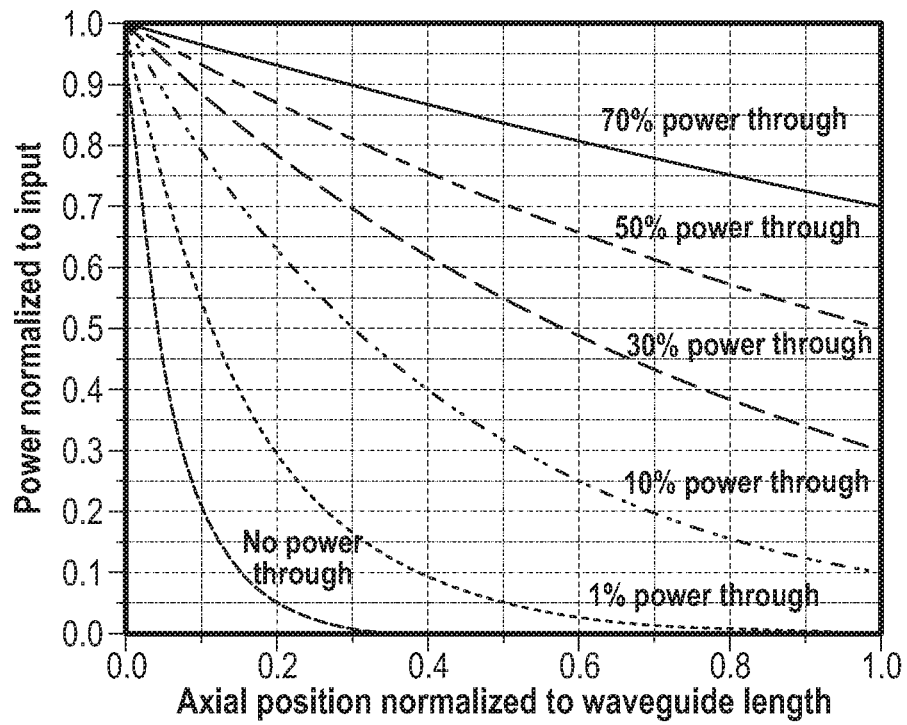
FIG. 25A shows a graph of the power as a function of axial position for a powered electrode powered from one end.
Figure 25B:
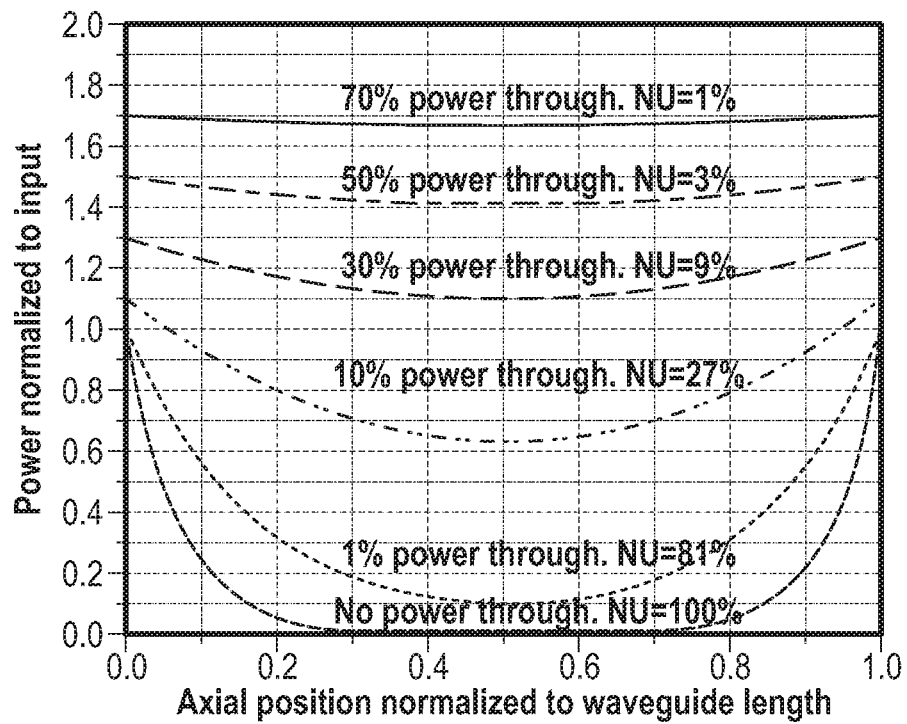
FIG. 25B shows a graph of the power as a function of axial position for a powered electrode powered from both ends.

FIG. 25A shows a graph of the power (normalized to the input power) as a function of axial position (normalized to the powered electrode length) for different power profiles. The power was applied to one side of the powered electrode at about 800 W. FIG. 25B shows a graph of the power (normalized to the input power) as a function of axial position (normalized to the powered electrode length) for a dual power powered electrode where about 800 W was applied to one end of the powered electrode and about 600 W was applied to the other end of the powered electrode. As the energy carried by the wave dissipated in the plasma, power in the antenna decreased from the wave launching point toward the opposite antenna-end (or plasma end).

Figure 26A:
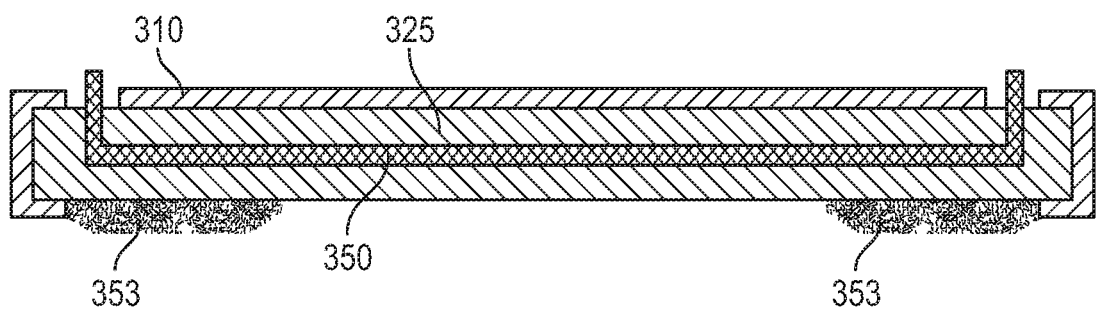
FIGS. 26A through 26C show schematic representations of the plasma generated as a function of power applied to both ends of the powered electrode.
Figure 26B:
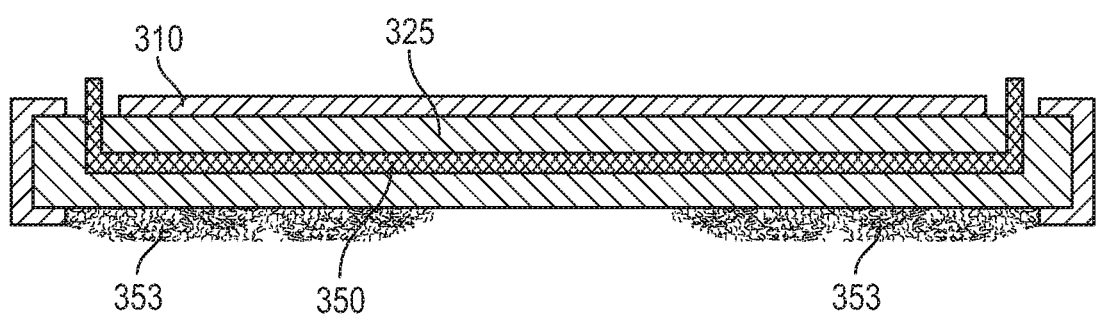
Figure 26C:
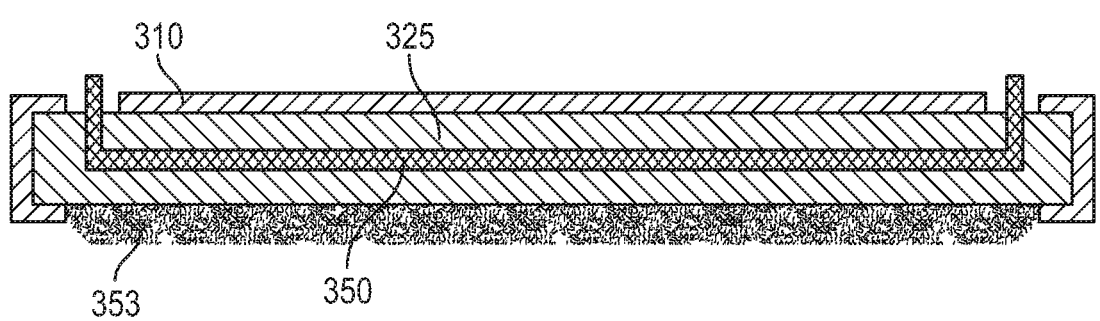

FIGS. 26A through 26C illustrate the wave propagation using a dual powered electrode. In FIG. 26A, the power supplied to the ends of the powered electrode 350 are not sufficient to form a plasma across the entire length of the powered electrode. In FIG. 26B, the power applied to the powered electrode are greater than in FIG. 26A but are still insufficient to form a plasma across the entire length. FIG. 26C illustrates the powered electrode with sufficient power applied to both ends to form a complete plasma across the length of the powered electrode. In some embodiments, the plasma formed is overdense (the electron density $\rho_e$ is higher than the critical plasma density $\rho_c$. Additionally, the plasma formed may have an electron density $\rho_e$ greater than the standing wave cutoff density. For example, at 2.45 GHz, the critical plasma density $\rho_c$=7×10$^{10}$ cm$^{-3}$ and the cutoff density for standing wave propagation along dielectric with relative permittivity of, e.g., 4 (quartz) is ~3×10$^{11}$ cm$^{-3}$.

The skilled artisan will recognize that although the plasma in FIG. 26C is generated across the entire length of the powered electrode, the plasma may not be uniform. Power applied to the ends of the powered electrode are one factor that can affect the completeness and uniformity of the electronic coupling of the powered electrode to the plasma and the resulting plasma density (electron density).

The conductive medium employed (i.e., the gas source in which a plasma is ignited) can affect the plasma uniformity and electron density. In some embodiments, the electron density of the plasma can be adjusted by adding argon to the plasma gas. For example, if a plasma is ignited using a nitrogen plasma, power loses to the chamber walls, atomic collisions that result in a loss of ionization (i.e., creating an excited atom that is not an ion), losses from energy imparting changes to vibrational or rotational states of the atoms, etc., can cause non-uniformity in the electron density. Adding a flow of argon into the nitrogen can increase the uniformity as argon does not suffer from as much loss as nitrogen.

Figure 27A:
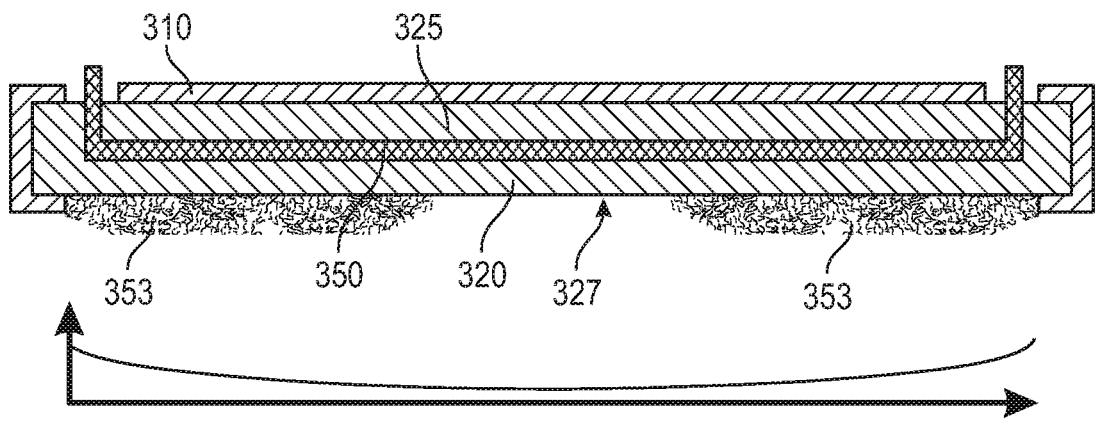
FIGS. 27A through 27D show schematic cross-sectional side views of a plasma source assembly with different plasma coupling in accordance with one or more embodiment of the disclosure.

Different factors can be modified to change the electron density and/or uniformity of the plasma. FIG. 27A illustrates a straight powered electrode 350 with a uniform distance between the ground electrode 310 and the outer face 327 of the dielectric 320. The plasma 353 is illustrated as being incomplete across the length of the powered electrode 350. The curve illustrated below the Figure shows the axial power-density (plasma) profile of the embodiment of FIG. 27A showing a decrease in plasma density near the middle of the electrode.

Figure 27B:
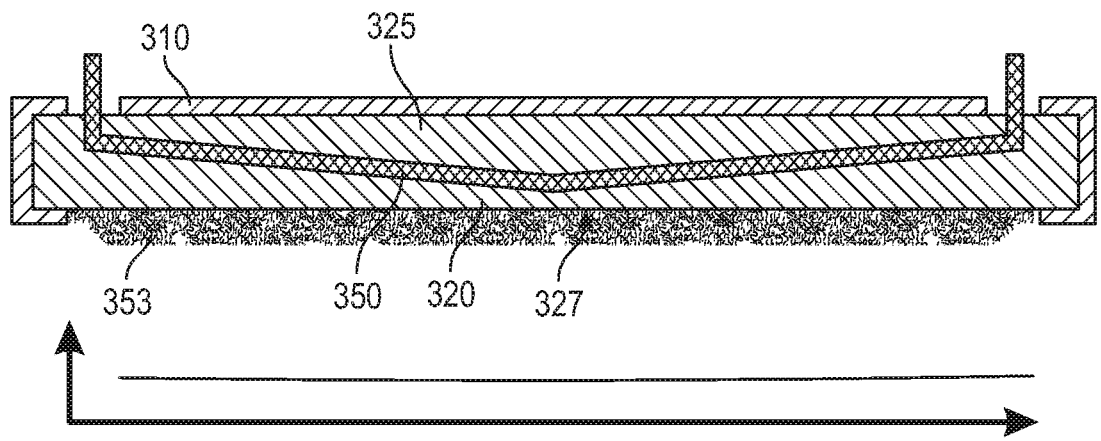

FIG. 27B illustrates an embodiment in which the powered electrode changes distance between the outer face 327 of the dielectric 320 so that the powered electrode 350 is closer to the plasma 353 near the middle of the length of the powered electrode 350. Decreasing the distance of the powered electrode 350 to the outer face 327 of the dielectric 320 increases the electronic coupling to the plasma 353. The width or thickness of the powered electrode 350 remains about the same across the length of the electrode. The curve illustrated below the Figure shows the axial power-density (plasma) profile of the embodiment of FIG. 27B which is more uniform across the length of the powered electrode than that of FIG. 27A.

The embodiment illustrated can also be considered to change the distance of the powered electrode to the ground electrode 310 across the length of the electrode. Decreasing the distance to the ground electrode 310 may decrease the electronic coupling to the plasma 353 by increasing the electronic coupling to ground. This embodiment is similar to that described with respect to FIGS. 6D and 6E.

Figure 27C:
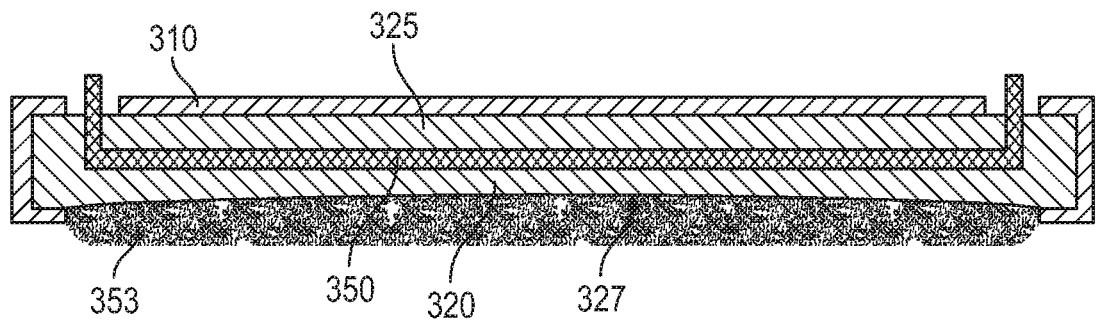

FIG. 27C illustrates an embodiment in which the shape of the dielectric 320 is changed so that the outer face 327 is closer to the powered electrode 350 near the middle of the length of the electrode. The powered electrode 350 of this embodiment is a flat electrode and the electronic coupling to the plasma 353 is modulated by the thickness of the dielectric 320.

Figure 27D:
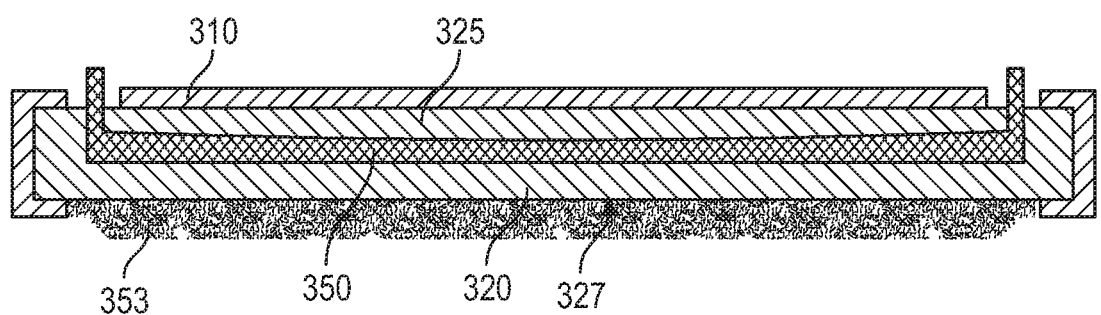

FIG. 27D illustrates an embodiment in which the shape of the powered electrode 350 is changed along the length of the electrode. In this embodiment, the powered electrode 350 is thicker near the ends of the electrode than near the middle. Changing the thickness of the electrode can change the electrocni coupling to one or more of the ground electrode 310 and/or the dielectric 320.

Figure 27E:
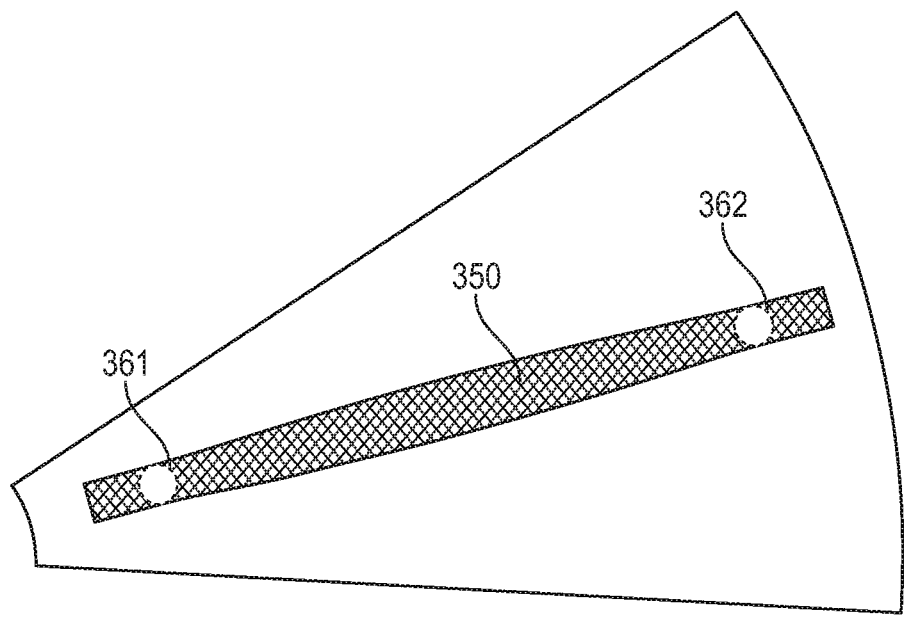
FIG. 27E shows a schematic front view of a plasma source assembly with a variable width powered electrode in accordance with one or more embodiment of the disclosure.

FIG. 27E illustrates a top view of an embodiment in which the width of the powered electrode 350 changes along the length of the electrode. Here, the width of the powered electrode is greatest in the middle portion of the electrode. The first feed 381 and second feed 382 are shown in phantom for illustrative purposes. The location of the feeds along the length of the powered electrode can be varied.

Figure 28:
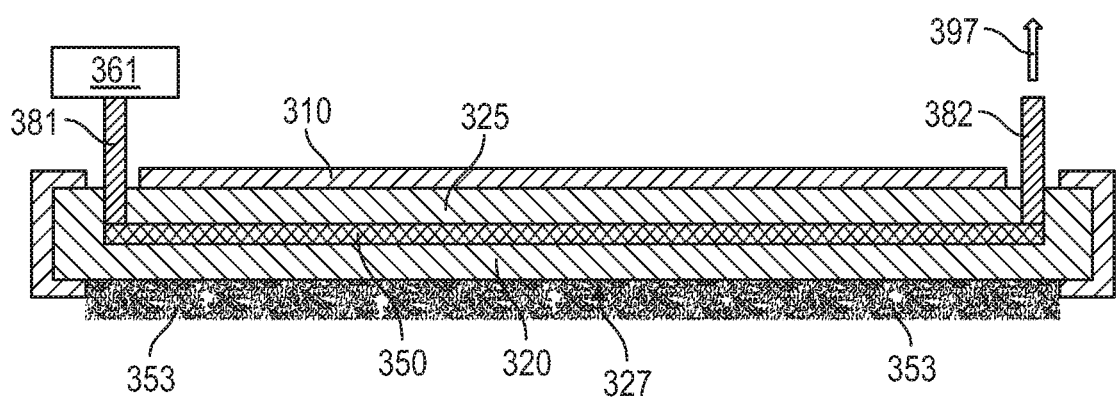
FIG. 28 shows a schematic cross-sectional view of a plasma source assembly with one feed in electrical connection with a dummy load in accordance with one or more embodiment of the disclosure.

FIG. 28 shows an embodiment of a plasma source assembly in which there are two connection ports with the powered electrode 350; one having a microwave source feed and the other terminated with a dummy and/or reactive load. The first feed 381 and a second feed 382 are electrically coupled to the powered electrode 350. A microwave generator 361 is electrically connected to the first feed 381 and the second feed 382 is electrically coupled with a dummy load 397. The microwave generator can be a fixed or variable frequency generator powering the electrode through one port and the other port can be "terminated". Power control and optional tuners at one or both ends can be included. In some embodiments, tuners are distributed between the two ends of the powered electrode and may provide changeable end-to-end poweriplasma axial distribution profile control. In some embodiments, additional fixed axial plasma/film profile control is included using axially varying applicator geometry (strip-line width/shape/position and/or dielectic dimensions or dielectric material permittivity) for example, as illustrated in FIGS. 27A through 27E.

The dummy load 397 can be a matched termination load or a reactive load (fixed or movable short). or a combination of dummy load and reactive load. In some embodiments, the dummy load is a matched termination load from the first microwave generator.

Figure 29:
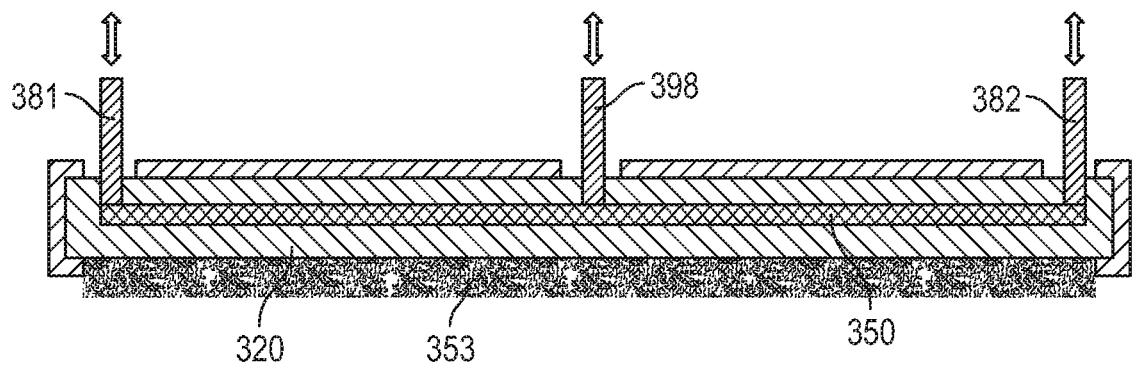
FIG. 29 shows a schematic cross-sectional view of a plasma source assembly with more than two feeds in accordance with one or more embodiment of the disclosure.

FIG. 29 shows another embodiment of a plasma source assembly in which there is at least one additional feed 398 electrically coupled to the powered electrode. The location and number of the at least one additional feed 398 can be varied. In some embodiments, there are one, two, three, four, five, six, seven, eight, nine or ten additional feeds, or in the range of 1 to 10 additional feeds. Each of the additional feeds 398 can be positioned independently of any of the other feeds.

The number of microwave generators can be varied with the number of feeds. For example, the embodiment illustrated has three feeds and may have three microwave generators providing power to the powered electrode. In some embodiments, there are less microwave generators than feeds. For example, the first feed 381 may be connected to a microwave generator and the other feeds (the second feed 382 and additional feed 398) may be connected to a dummy load and/or reactive load. In some embodiments, at least one of the dummy loads is a matched termination load of the first microwave generator. At least one microwave generator is connected to the feeds. Power control and optional tuners can be at each port or can be distributed between the ports to provide changeable end-to-end power/plasma axial distribution profile. Additional (fixed) axial plasma/film profile control is possible by axially varying applicator geometry (powered electrode width/shape/position and/or dielectric dimensions or dielectric material permittivity).

A first embodiment of the disclosure is directed to a plasma source assembly comprising: a powered electrode having a first end and a second end defining a length and having an elongate axis extending along the length of the powered electrode, the powered electrode having a thickness and width; a ground electrode on a first side of the powered electrode, the ground electrode spaced from the powered electrode by a distance; a dielectric on a second side of the powered electrode, the dielectric and ground electrode enclosing the powered electrode, the dielectric having an inner face adjacent the powered electrode and an outer face opposite the inner face; a first microwave generator electrically coupled to the first end of the powered electrode through a first feed; and a second microwave generator electrically coupled to the second end of the powered electrode through a second feed.

In a second embodiment, the first embodiment is modified wherein the ground electrode is spaced from the powered electrode by a second dielectric.

In a third embodiment, any of the first or second embodiment is modified wherein the powered electrode is a flat conductor.

In a fourth embodiment, any of the first through third embodiment is modified wherein one or more of the width of the powered electrode changes from the first end to the second end, the distance from powered electrode to the ground electrode changes from first end to second end; or a distance from powered electrode to the outer face of the dielectric changes from first end to the second end.

In a fifth embodiment, any of the first through fourth embodiment is modified wherein the powered electrode is moved a distance from the inner face of the dielectric to create an air gap.

In a sixth embodiment, any of the first through fifth embodiments is modified further comprising one or more stub tuner located at one or more positions along the length of the powered electrode.

In a seventh embodiment, any of the first through sixth embodiment is modified wherein wherein the stub tuner comprises a sliding short positioned adjacent the first feed and the second feed.

In an eighth embodiment, any of the first through seventh embodiment is modified wherein wherein there are stub tuners are positioned adjacent the first feed and the second feed.

In a ninth embodiment, any of the first through eighth embodiments is modified wherein the powered electrode further comprises a first leg at the first end and a second leg at the second end.

In a tenth embodiment, any of the first through ninth embodiment is modified wherein the first feed and second feed are coaxial with the powered electrode and the first leg and second leg extend at an angle to the axis of the powered electrode.

In an eleventh embodiment, any of the first through tenth embodiment is modified further comprising one or more stub tuners positioned along the length of the powered electrode.

In a twelfth embodiment, any of the first through eleventh embodiment is modified wherein the stub tuner comprises a sliding short positioned at an end of the first leg and a sliding short positioned at an end of the second leg.

In a thirteenth embodiment, any of the first through twelfth embodiment is modified wherein stub tuner is positioned adjacent the first leg and a stub tuner positioned adjacent the second leg.

In a fourteenth embodiment, any of the first through thirteenth embodiment is modified wherein wherein the first feed and the second feed extend at an angle to the axis of the powered electrode and the first leg and the second leg are coaxial with the powered electrode.

In a fifteenth embodiment, any of the first through fourteenth embodiments is modified further comprising one or more stub tuner positioned at an end of the first leg and at an end of the second leg.

In a sixteenth embodiment, any of the first through fifteenth embodiment is modified wherein the stub tuner comprises a sliding short positioned adjacent the first leg and a sliding short positioned adjacent the second leg.

In a seventeenth embodiment, any of the first through sixteenth embodiment is modified wherein the first microwave generator and the second microwave generator operate at a frequency in the range of about 900 to about 930 MHz or in the range of about 2.4 to about 2.5 GHz, In an eighteenth embodiment, any of the first through seventeenth embodiment is modified wherein the first microwave generator and the second microwave generator operate at different frequencies.

In a nineteenth embodiment, any of the first through eighteenth embodiment is modified further comprising a gas inlet in the ground electrode, the gas inlet in fluid communication with one or more plenum extending along the elongate axis, the one or more plenum in fluid communication with one or more gas conduits to provide a flow of gas from the gas inlet to flow through the ground electrode and the dielectric to a gas channel extending along the elongate axis of the plasma source assembly.

In a twentieth embodiment, any of the first through nineteenth embodiment is modified wherein the distance of the powered electrode to the outer face of the dielectric changes across the length of the powered electrode.

In a twenty-first embodiment, any of the first through twentieth embodiment is modified wherein the distance of the powered electrode to the ground electrode changes across the length of the powered electrode.

In a twenty-second embodiment, any of the first through twenty-first embodiment is modified wherein one or more of the thickness or width of the powered electrode changes along the length of the powered electrode.

In a twenty-third embodiment, any of the first through twenty-second embodiment is modified further comprising a third microwave generator electrically coupled to the powered electrode through a third feed, the third feed located along the length of the powered electrode between the first feed and the second feed.

In a twenty-fourth embodiment, any of the first through twenty-third embodiment is modified further comprising a fourth microwave generator electrically coupled to the powered electrode through a fourth feed, the fourth feed located along the length of the powered electrode between the first feed and the second feed.

In a twenty-fifth embodiment, any of the first through twenty-fourth embodiment is modified further comprising a fifth microwave generator electrically coupled to the powered electrode through a fifth feed, the fifth feed located along the length of the powered electrode between the first feed and the second feed.

A twenty-sixth embodiment is directed to a gas distribution assembly comprising the plasma source assembly of any of the first embodiment through the twenty-fifth embodiment.

A twenty-seventh embodiment is directed to a plasma source assembly comprising: a flat powered electrode having a first end and a second end and having an axis extending along an elongate axis of the plasma source assembly, the powered electrode having a width; a ground electrode on a first side of the powered electrode, the ground electrode spaced from the powered electrode by a second dielectric, the ground electrode including a gas inlet; a dielectric on a second side of the powered electrode, the dielectric and second dielectric enclosing the powered electrode to prevent electrical contact between the powered electrode and the ground electrode, the dielectric having a gas channel extending along the elongate axis of the plasma source assembly, the gas inlet is in fluid communication with one or more plenum extending along elongate axis, the one or more plenum in fluid communication with the gas channel through one or more gas conduits; a first microwave generator electrically coupled to the first end of the powered electrode through a first feed, the first microwave generator operating at a first frequency; and a second microwave generator electrically coupled to the second end of the powered electrode through a second feed, the second microwave generator operating at a second frequency, wherein the first frequency and the second frequency are within the range of about 900 MHz to about 930 MHz or in the range of about 2.4 to about 2.5 GHz and the first frequency and the second frequency are different.

A twenty-eighth embodiment is directed to a method of providing a plasma, the method comprising: providing first microwave power from a first microwave generator to a first end of a powered electrode and second microwave power from a second microwave generator to a second end of the powered electrode, the first microwave power and second microwave power operating at frequencies in the range of about 900 MHz to about 930 MHz or in the range of about 2.4 to about 2.5 GHz, the powered electrode enclosed in a dielectric with a ground electrode on a first side of the powered electrode, wherein a plasma is formed adjacent the dielectric on a second side of the powered electrode different from the first side, the plasma source assembly comprising: a powered electrode having a first end and a second end defining a length and having an axis extending along the length of the powered electrode, the powered electrode having a width; a ground electrode on a first side of the powered electrode, the ground electrode spaced from the powered electrode by a distance; a dielectric on a second side of the powered electrode, the dielectric and ground electrode enclosing the powered electrode, the dielectric having an inner face adjacent the powered electrode and an outer face opposite the inner face; and a first feed electrically coupled to the powered electrode and a second feed electrically coupled to the powered electrode, the first feed electrically coupled with a first microwave generator, the second feed electrically coupled with a dummy load.

In a twenty-ninth embodiment, the twenty-eight embodiment is modified wherein the dummy load is a matched termination load of the first microwave generator.

In a thirtieth embodiment, any of the twenty-eight through twenty-ninth embodiment is modified further comprising at least one additional feed electrically coupled to the powered electrode.

In a thirty-first embodiment, any of the twenty-eighth through thirtieth embodiment is modified wherein there are in the range of 1 to 10 additional feeds electrically coupled to the powered electrode at points along the length of the powered electrode.

In a thirty-second embodiment, any of the twenty-eight through thirty-first embodiment is modified further comprising at least one additional microwave generator electrically coupled to at least one of the additional feeds.

In a thirty-third embodiment, any of the twenty-eight through thirty-second embodiment is modified wherein the first microwave generator is electrically coupled to the first feed and a dummy load is electrically coupled to the other feeds.

In a thirty-fourth embodiment, any of the twenty-eight through thirty-second embodiment is modified wherein at least one of the dummy loads is a matched termination load of the first microwave generator.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by modifying any suitable parameters including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A plasma source assembly comprising:
a powered electrode having a first end and a second end defining a length and having an elongate axis extending along the length of the powered electrode, the powered electrode having a thickness and width;
a ground electrode on a first side of the powered electrode, the ground electrode spaced from the powered electrode by a distance;
a dielectric on a second side of the powered electrode, the dielectric and ground electrode enclosing the powered electrode, the dielectric having an inner face adjacent the powered electrode and an outer face opposite the inner face;
a first microwave generator electrically coupled to the first end of the powered electrode through a first feed; and
a second microwave generator electrically coupled to the second end of the powered electrode through a second feed.

2. The plasma source assembly of claim 1, wherein the ground electrode is spaced from the powered electrode by a second dielectric.

3. The plasma source assembly of claim 1, wherein the powered electrode is a flat conductor.

4. The plasma source assembly of claim 1, wherein one or more of the width of the powered electrode changes from the first end to the second end, the distance from powered electrode to the ground electrode changes from first end to second end; or a distance from powered electrode to the outer face of the dielectric changes from first end to the second end.

5. The plasma source assembly of claim 4, wherein the powered electrode is moved a distance from the inner face of the dielectric to create an air gap.

6. The plasma source assembly of claim 1, wherein the powered electrode further comprises a first leg at the first end and a second leg at the second end.

7. The plasma source assembly of claim 6, wherein the first feed and the second feed extend at an angle to the axis of the powered electrode and the first leg and the second leg are coaxial with the powered electrode.

8. The plasma source assembly of claim 7, further comprising one or more stub tuner positioned at an end of the first leg and at an end of the second leg.

9. The plasma source assembly of claim 8, wherein the stub tuner comprises a sliding short positioned adjacent the first leg and a sliding short positioned adjacent the second leg.

10. The plasma source assembly of claim 1, wherein the first microwave generator and the second microwave generator operate at a frequency in the range of about 900 to about 930 MHz or in the range of about 2.4 to about 2.5 GHz.

11. The plasma source assembly of claim 10, wherein the first microwave generator and the second microwave generator operate at different frequencies.

12. The plasma source assembly of claim 1, wherein the distance of the powered electrode to the outer face of the dielectric changes across the length of the powered electrode.

13. The plasma source assembly of claim 1, wherein the distance of the powered electrode to the ground electrode changes across the length of the powered electrode.

14. The plasma source assembly of claim 1, wherein one or more of the thickness or width of the powered electrode changes along the length of the powered electrode.

15. A gas distribution assembly comprising the plasma source assembly of claim 1.

16. A plasma source assembly comprising:
a flat powered electrode having a first end and a second end and having an axis extending along an elongate axis of the plasma source assembly, the powered electrode having a width;
a ground electrode on a first side of the powered electrode, the ground electrode spaced from the powered electrode by a second dielectric, the ground electrode including a gas inlet;
a dielectric on a second side of the powered electrode, the dielectric and second dielectric enclosing the powered electrode to prevent electrical contact between the powered electrode and the ground electrode, the dielectric having a gas channel extending along the elongate axis of the plasma source assembly, the gas inlet is in fluid communication with one or more plenum extending along elongate axis, the one or more plenum in fluid communication with the gas channel through one or more gas conduits;
a first microwave generator electrically coupled to the first end of the powered electrode through a first feed, the first microwave generator operating at a first frequency; and
a second microwave generator electrically coupled to the second end of the powered electrode through a second feed, the second microwave generator operating at a second frequency,
wherein the first frequency and the second frequency are within the range of about 900 MHz to about 930 MHz or in the range of about 2.4 to about 2.5 GHz and the first frequency and the second frequency are different.

17. A method of providing a plasma, the method comprising: providing first microwave power from a first microwave generator to a first end of a powered electrode and second microwave power from a second microwave generator to a second end of the powered electrode, the first microwave power and second microwave power operating at frequencies in the range of about 900 MHz to about 930 MHz or in the range of about 2.4 to about 2.5 GHz, the powered electrode enclosed in a dielectric with a ground electrode on a first side of the powered electrode, wherein a plasma is formed adjacent the dielectric on a second side of the powered electrode different from the first side, the first end and second end of the powered electrode defining a length and an axis extending along the length of the powered electrode, the powered electrode having a width, the ground electrode spaced from the powered electrode by a distance, the dielectric having an inner face adjacent the powered electrode and an outer face opposite the inner face, the first feed electrically coupled to the powered electrode and the second feed electrically coupled to the powered electrode, the first feed electrically coupled with the first microwave generator, the second feed electrically coupled with a dummy load.

18. The method of claim 17, wherein the dummy load is a matched termination load of the first microwave generator.

19. The method of claim 17, further comprising at least one additional feed electrically coupled to the powered electrode.

20. The plasma source assembly of claim 17, wherein there are in the range of 1 to 10 additional feeds electrically coupled to the powered electrode at points along the length of the powered electrode.

* * * * *